(12) United States Patent  (10) Patent No.: US 7,633,112 B2
Won et al.  (45) Date of Patent: Dec. 15, 2009

(54) METAL-INSULATOR-METAL CAPACITOR AND METHOD OF MANUFACTURING THE SAME

(75) Inventors: Seok-jun Won, Seoul (KR); Jung-min Park, Ansan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 190 days.

(21) Appl. No.: 11/508,890

(22) Filed: Aug. 24, 2006

(65) Prior Publication Data

US 2008/0050874 A1 Feb. 28, 2008

(51) Int. Cl.
*H01L 29/76* (2006.01)
(52) U.S. Cl. ............................. 257/308; 257/E27.048; 257/E29.343; 257/E29.345
(58) Field of Classification Search ................ 438/239, 438/253; 257/301, 303, 308, 516, 532
See application file for complete search history.

(56) References Cited

U.S. PATENT DOCUMENTS

| 5,920,763 | A | * | 7/1999 | Schuegraf | 438/3 |
| 6,100,155 | A | | 8/2000 | Hu | |
| 6,251,740 | B1 | | 6/2001 | Johnson et al. | |
| 6,559,004 | B1 | * | 5/2003 | Yang et al. | 438/253 |
| 6,620,701 | B2 | | 9/2003 | Ning | |
| 6,638,830 | B1 | | 10/2003 | Tsai et al. | |
| 7,186,625 | B2 | * | 3/2007 | Chudzik et al. | 438/387 |
| 2005/0282348 | A1 | * | 12/2005 | Lee | 438/396 |

FOREIGN PATENT DOCUMENTS

KR 1020020001375 A 1/2002

* cited by examiner

*Primary Examiner*—Quoc D Hoang
(74) *Attorney, Agent, or Firm*—Volentine & Whitt, P.L.L.C.

(57) ABSTRACT

A metal-insulator-metal capacitor includes a first electrode in a first wiring level, a second electrode above the first wiring level and extending into a first portion of the first electrode that surrounds the second electrode, and a dielectric film separating the first electrode from the second electrode.

11 Claims, 19 Drawing Sheets

METAL-INSULATOR-METAL CAPACITOR AND METHOD OF MANUFACTURING THE SAME

The present invention claims the benefit of Korean Patent Application No. 10-2005-0077382 filed on Aug. 23, 2005 in Korea, which is hereby incorporated by reference in its entirety.

BACKGROUND OF THE INVENTION

1. Field of the Invention

The present invention relates to a capacitor, and more particularly, to a metal-insulator-metal capacitor and method of manufacturing the same. Although the present invention is suitable for a wide scope of applications, it is particularly suitable for increasing the integration of a metal-insulator-metal capacitor.

2. Discussion of the Related Art

In general, semiconductor circuits are fabricated in and on a semiconductor substrate. Active devices, such as transistors and diodes are formed in the semiconductor substrate. Further, active devices as well as passive devices, such as capacitors and inductors can be formed on the semiconductor substrate. Wiring is also formed on the semiconductor substrate to interconnect to the active and passive devices. The wiring includes wiring lines and vias for interconnection to devices and/or to other wiring lines.

A capacitor includes a first electrode, a second electrode and a dielectric film interposed between the first and second electrodes. Capacitance C of a capacitor is expressed as the following equation (1):

$$C = \epsilon \cdot As/d \quad (1)$$

In the above equation (1), C denotes capacitance of the capacitor, $\epsilon$ denotes dielectric constant of a dielectric material in the capacitor, As denotes surface area in which the first and second electrodes of the capacitor oppose each other, and d denotes thickness of the dielectric film between the first and second electrodes in the capacitor. In accordance with equation (1), the capacitance of a capacitor may be increased by (a) reducing the thickness d of the dielectric film in the capacitor, (b) increasing the surface area As of the capacitor, or (c) using a dielectric material for the dielectric film that has a high dielectric constant $\epsilon$.

A conventional capacitor for use in a semiconductor circuit includes a first polysilicon plate, a second polysilicon plate and a dielectric film interposed therebetween. Because the plates of the capacitor are polysilicon, the dielectric film must have a sufficient thickness to prevent shorting between the two plates caused by any malformations of the polysilicon. Such a plate capacitor is a planar or two dimensional type of capacitor. Thus, increasing the surface area As of a conventional planar type capacitor increases the amount of surface area used the semiconductor substrate, which degrades integration. To increase surface area As without decreasing integration, a three dimensional (3D) capacitor is used instead of the planar type capacitor. To reduce the thickness d, metal electrodes with less probability of having malformations are used instead of polysilicon. Capacitors with metal electrodes are otherwise known as metal-insulator-metal (MIM) capacitors.

Conventionally, interconnection between a device and a wiring line or between two wiring lines is done by a plug structure, such as a tungsten plug. Such structures require at least two entirely separate processing procedures including one for forming the plug followed by another one for forming the wiring line. A single processing procedure known as a dual damascene process is used to form both a wiring line and a via from the wiring line to a device or to another wiring line at the same time.

A dual damascene process forms a dielectric layer with a contact hole for a via in a bottom portion of the dielectric layer and a trench in an upper portion of the dielectric layer. Then, a conductive material is provided in the trench and the contact hole to form the wiring line and the via. The via acts like a plug structure in the conventional interconnection structure. Further, the via is integrally connected to the wiring line in the trench because the via is filled with a conductive material while the trench is filled with the same conductive material during the same process step in which the conductive material is deposited. Thus, the dual damascene process eliminates the need to form a plug structure in a separate process from the process of forming the wiring line.

There are two basic ways of initiating a dual damascene process. One way is the trench-first dual damascene in which the trench is first formed in the dielectric layer and then the contact hole for the via is formed. Another way is the hole-first dual damascene, which forms a hole through the dielectric layer and forms the trench in the dielectric layer across the hole such that there is a contact hole in the dielectric layer at the bottom of the trench.

Typically, the processing procedures for forming capacitors are separate from dual damascene process for forming wiring lines with vias. Thus, the formation of capacitors and wiring on a semiconductor substrate is a start, stop, re-start, and stop process in the sense that a wiring forming process is started and stopped so a capacitor forming process can start, and then the capacitor forming process is stopped so that the wiring forming process can restart. The prior art also has other problems that will be explained in reference to prior art shown in FIGS. 7 to 9.

FIG. 7 is a cross-sectional view of an MIM capacitor disclosed in U.S. patent application no. 2006/0009065. A lower electrode 131 of the capacitor is a barrier metal, such as Ta, TaN, Ti and TiN. Barrier metals have a high resistivity. Thus, such a capacitor disclosed in U.S. patent application no. 2006/0009065 can not be used in a high frequency device. Further, the protruding portions 122 of the lower electrode of the capacitor in U.S. patent application no. 2006/0009065 has a height that is not higher than the via portion of the wiring 117.

FIG. 8 is a cross-sectional view of an MIM capacitor disclosed in U.S. Pat. No. 6,620,701. As shown in FIG. 8, a first electrode 18 is formed within a trench of dielectric 14. Then, portions of the dielectric 14 between nodes of the first electrode 18 are dry etched. The first electrode 18 may be damaged by the dry etch. A dielectric film 26 is disposed on the first electrode 18. Conductive lines of a second electrode are provided between the nodes of the first electrode 18 and then an upper electrode of the second electrode is provided on the conductive lines. Then, chemical-mechanical polish (CMP) is performed to planarize the upper surface of the upper electrode of the second electrode. When the CMP of upper electrode is performed, the dielectric film between the first and second electrodes may be revealed by a dishing problem of the CMP.

FIG. 9 is a cross-sectional view of an MIM capacitor disclosed in U.S. Pat. No. 6,638,830. Nodes 28 of a first electrode of the capacitor are in the trench-level of a dielectric layer 18, as shown in FIG. 9. When dry etch is performed prior to forming the second electrodes, the nodes 28 may be damaged. CMP by-products may electrically connect the first and second electrodes of the capacitor together.

FIG. 10 is a cross-sectional view of an MIM capacitor disclosed in U.S. Pat. No. 6,559,004. Nodes 27 of a first electrode of the capacitor are in the via-level 28 of the dielectric layer 22. When CMP of upper electrode is performed, dielectric film 23 may be revealed by the CMP dishing problem.

As can be seen from the above discussion, there is a need for combining a process for forming a capacitor together with a dual damascene process for forming wiring lines and vias. Further, there is a need for a low resistivity metal electrode capacitor, which is compatible with the dual damascene process. Furthermore, there is a need for a high capacity capacitor with high integration.

SUMMARY OF THE INVENTION

Accordingly, the present invention is directed to a metal-insulator-capacitor and method of manufacturing the same that substantially obviate one or more of the problems due to limitations and disadvantages of the related art.

An object of the present invention is to provide an MIM capacitor with increased integration.

Another object of the present invention is to provide an MIM capacitor with increased capacity.

Another object of the present invention is to provide a process for forming a capacitor together with a dual damascene process for forming interconnection lines and vias.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the metal-insulator-metal capacitor includes a first electrode in a first wiring level, a second electrode above the first wiring level and extending into a first portion of the first electrode that surrounds the second electrode, and a dielectric film separating the first electrode from the second electrode.

In another aspect, a metal-insulator-metal capacitor includes a first dielectric layer, a lower electrode in the first interlayer dielectric layer, a second dielectric layer over the first dielectric layer, a surround electrode in the second dielectric layer and on the lower electrode, an upper electrode in the surround electrode, and a dielectric film on the lower electrode and the surround electrode to separate the upper electrode from the lower electrode and the surround electrode.

In another aspect, a method of manufacturing a metal-insulator-metal capacitor on a substrate includes forming a first electrode in a wiring level, forming a dielectric film on the first electrode, forming a second electrode above the wiring level and extending into a first portion of the first electrode that surrounds the second electrode, and forming a dielectric film separating the first electrode from the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1b is a plan view of the three dimensional MIM capacitor shown in FIG. 1a;

FIG. 1c. is an expanded cross-sectional view illustrating the cross-sectional area B-B' of FIG. 1a;

FIG. 5 is a flowchart of a method of manufacturing the three dimensional MIM capacitor shown in FIG. 1a;

DETAILED DESCRIPTION OF THE PREFERRED EMBODIMENTS

Figure 1A:
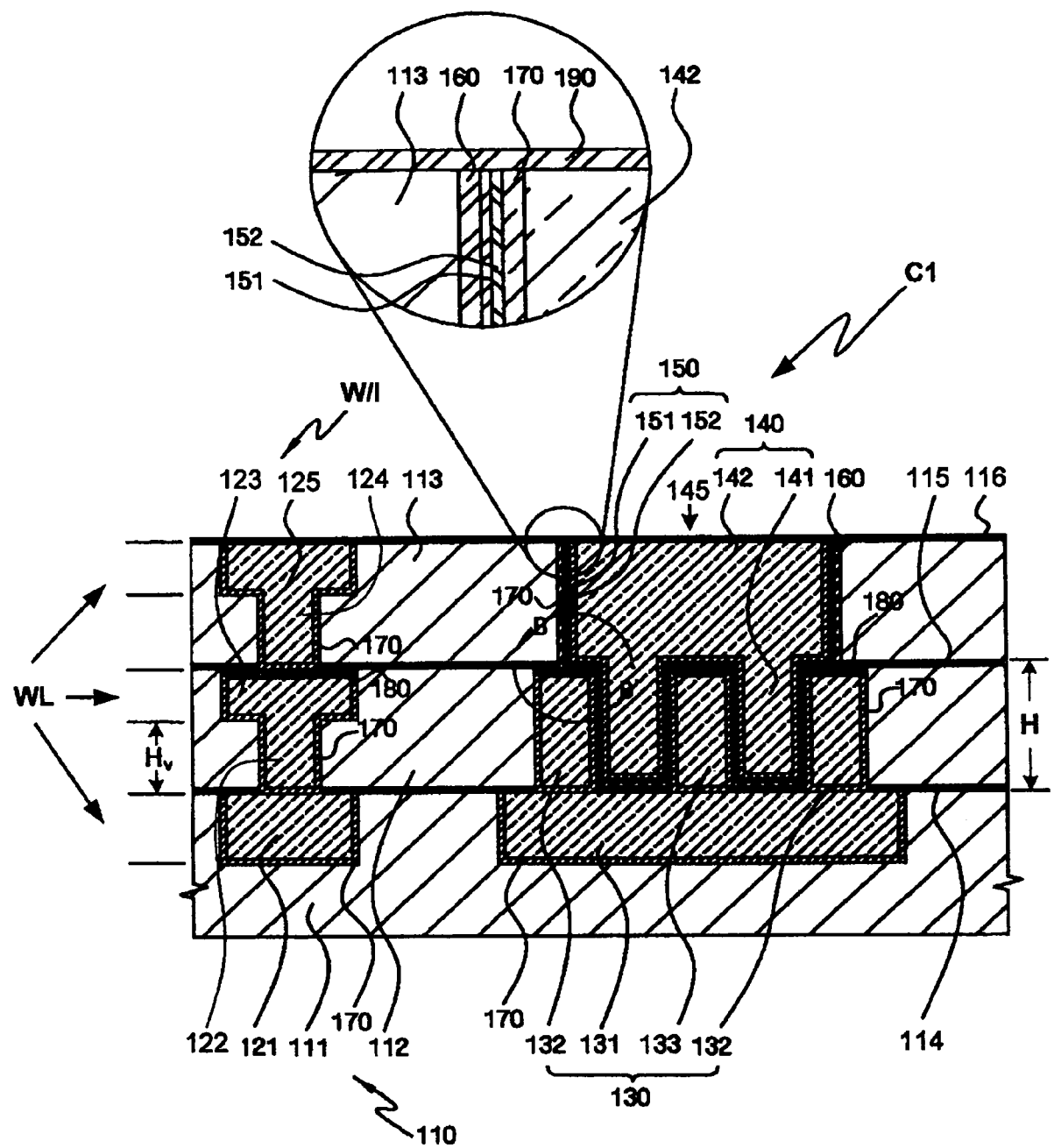
FIG. 1a is a cross-sectional view of a three dimensional MIM capacitor according to a first embodiment of the present invention.

Reference will now be made in detail to the preferred embodiments of the present invention, examples of which are illustrated in the accompanying drawings. The invention may, however, be embodied in many different forms and should not be construed as being limited to the embodiments set forth herein, rather, these embodiments are provided so that this disclosure will be thorough and complete, and will fully convey the concept of the invention to those skilled in the art. It will be understood that when an element is referred to as being "on" another element, it can be contacting the other element or another intervening elements may also be present. It will also be appreciated by those of skill in the art that references to a structure or feature that is disposed "adjacent" another feature may have portions that overlap or underlie the adjacent feature. In the drawings, the thicknesses of layers and regions are exaggerated for clarity. Like reference numerals in the drawings denote like elements.

FIG. 1a is a cross-sectional view of a three dimensional MIM capacitor according to a first embodiment of the present invention. As shown in FIG. 1a, a semiconductor circuit includes wiring levels WL having an interconnection/wiring structure I/W and a capacitor C1. Each of the wiring levels WL includes at least one wiring line. As shown in FIG. 1a, a first wiring level includes a first wiring line 121, a second wiring level includes a second wiring line 123 and a third wiring level includes a third wiring line 125.

The wiring lines of the wiring levels WL can be in dielectric layers. As shown in FIG. 1a, the first wiring line 121 is in a trench of a first dielectric layer 111, the second wiring line 123 is in a trench of a second dielectric layer 112 and the third wiring line 125 is in a trench of a third dielectric layer 113. A low-k dielectric material can be used for the dielectric layers to reduce parasitic capacitance.

The interconnection/wiring structures I/W include wiring lines and at least one via for interconnecting the wiring lines in different wiring levels WL. As shown in FIG. 1a, a first via 122 interconnects the first wiring line 121 and the second wiring line 123 through a contact hole in the second dielectric layer 112. Further, a second via 124 interconnects the second wiring line 123 and the third wiring line 125 through a contact hole in the third dielectric layer 113. Although not shown in FIG. 1a, a via can be formed between the first wiring line 121 and a semiconductor device in a semiconductor substrate (not shown) below the first wiring line 121. In addition, a via can interconnect wiring lines on two different wiring levels that are separated by one or more other wiring levels.

A first etch-stop layer 114 is located between the first dielectric layer 111 and the second dielectric layer 112. Further, a second etch-stop layer 115 is located between the second dielectric layer 112 and the third dielectric layer 113. Furthermore, a third etch-stop layer 116 is located on an upper surface of the third dielectric layer 113. The first, second and third etch-stop layers 114, 115 and 116 prevent over etching into a wiring line during the damascene processing for a contact hole in the dielectric layer above the wiring line. The first, second and third etch-stop layers 114, 115 and 116 can be at least of SiN, SiNC and other types of dielectric materials used for selective etching to prevent over-etching.

The first wiring line 121 can be separated from the first dielectric layer 111 by a barrier layer 170. The second wiring line 123 and the first via 122 can be separated from the second dielectric layer 112 by a barrier layer 170. The third wiring line 125 and the second via 124 can be separated from the second dielectric layer 112 by a barrier layer 170. The wiring lines and vias are formed of a low resistivity metal, such as copper, aluminum or a combination thereof. The barrier layers 170 prevent the low resistivity metal of the wiring lines and vias from interacting with the dielectric layers. In addition or in the alternative, the barrier layers 170 prevent oxidation of the wiring lines and of the vias. The barrier layers 170 can be at least one of Ti, TiN, Ta, TaN, TaAlN, TaSiN, TaSi2, TiSiN and WN. A metal capping layer 180 can be provided between the second wiring line 123 and the second via 124. The metal capping layer 180 is a remnant from the fabrication process of the capacitor.

The capacitor C1 of FIG. 1a includes a first capacitor electrode 130, a dielectric film 150 on the first capacitor electrode 130 and a second capacitor electrode 140 on the dielectric film 150. More specifically, the first capacitor electrode 130 can include a lower electrode portion 131 in the wiring level WL of the first wiring line 121, a surround electrode portion 132 in the wiring level WL of the second wiring line 123 and a pillar electrode portion 133 also in the wiring level WL of the second wiring line 123. The lower electrode portion 131 is in a trench of the first dielectric layer 111 and formed of low resistivity metal, such as copper, aluminum or a combination thereof. The first wiring line 121 and the lower electrode portion 131 can both be made of the same material. A barrier layer 170 can be used to separate the lower electrode portion 131 from the first dielectric layer 111 to prevent the lower electrode from spiking into or reacting with the first dielectric layer 111.

The surround electrode portion 132 (the first portion of the first electrode is in an opening of second dielectric layer 112 and formed of low resistivity metal, such as copper, aluminum or a combination thereof. As shown in FIG. 1a, the height H of the surround portion 132 from the lower electrode portion 131 (the second portion of the first electrode) is the same as the height H as the top surface of second wiring line 123 from the first wiring line 121. Thus, the height H of the surround electrode portion 132 from the lower electrode portion 131 is greater than the height $H_v$ of the first via 122 from the first wiring line 121. The lower electrode portion 131, the surround electrode portion 132 and each pillar electrode portion 133 (the third portion of the first electrode) can be made of the same material, such as copper, aluminum or a combination thereof. Further, the second wiring line 123, the first via 122, the surround electrode portion 132 and each pillar electrode portion 133 can be made of the same material, such as copper, aluminum or a combination thereof.

Figure 1B:
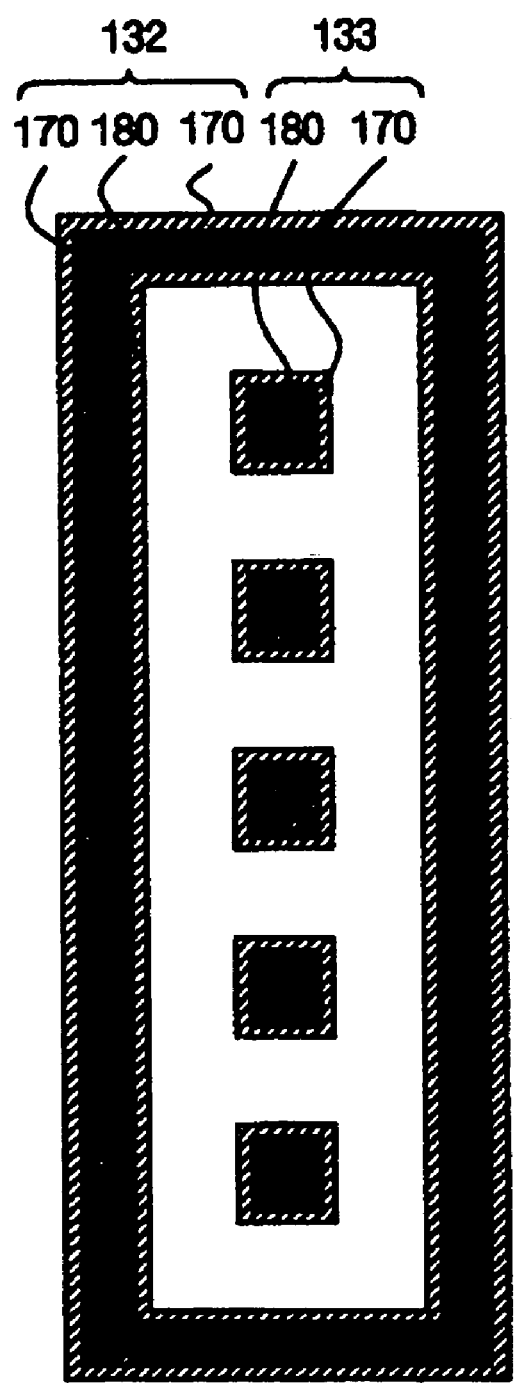

FIG. 1b is a plan view of the 3D MIM capacitor shown in FIG. 1a. As shown in FIG. 1b, the surround electrode portion 132 is on the lower electrode portion 131 and encompasses an area or is hollow. Although the surround electrode portion 132 is shown as a rectangular shape in FIG. 1b, the surround electrode can have any polygonal or curved shape as well as have a shape that is a combination of curves and straight lines. A pillar electrode portion 133 can also be on the lower electrode portion 132. The pillar electrode portion 133 is within or encompassed by the surround electrode portion 132. As shown in FIG. 1b, a plurality of pillar electrode portions 133 can be positioned within the surround electrode portion 132.

As shown in FIG. 1a, a barrier layer 170 can be used on the sidewalls of the surround electrode portion 132 to separate the surround electrode portion 132 from the second dielectric layer 112. The sidewalls of each pillar electrode portion 133 can have a barrier layer 170. A barrier layer 170 can be formed on an inner surface of the surround electrode portion 132. The barrier layers 170 on the sidewalls of each pillar electrode portion 133 and on the inner surface of the surround electrode portion 132 prevents the metal of the pillar electrode portion 133 and the surround electrode portion 132 from reacting with subsequently deposited insulating films. In addition or in the alternative, the barrier layers 170 prevent oxidation of the pillar electrode portion 133 and the surround electrode portion 132. As discussed above, the barrier layers 170 can be at least one of Ti, TiN, Ta, TaN, TaAlN, TaSiN, TaSi2, TiSiN and WN.

A capping layer 180 is formed on the upper surfaces of both the surround electrode portion 132 and each pillar electrode portion 133. The capping layer 180 prevents oxidation of the surround electrode portion 132 and each pillar electrode portion 133. In the alternative or in addition, the capping layer 180 prevents the metal of the pillar electrode portion 133 and the surround electrode portion 132 from reacting with subsequently deposited insulating films. The capping layer 180 can be formed of a selective capping metal, such as CoWP.

The second capacitor electrode 140 of the capacitor C1 is in the wiring level WL containing the third wiring line 125 and in another wiring level WL containing the second wiring line 123. The second capacitor electrode 140 can include an extending electrode portion 141 extending in the surround electrode portion 132 of the first capacitor electrode 130 and an upper electrode portion 142 above the surround electrode portion of the first capacitor 130. The extending electrode portion 141 and the upper electrode portion 142 can be made of copper, aluminum or a combination thereof. Further, the third wiring line 125, the second via 124, the extending electrode portion 141 and the upper electrode portion 142 can be made of the same material, such as copper, aluminum or a combination thereof.

The extending electrode portion 141 of the first capacitor 130 surrounds the pillar electrode portion 133. Thus, the extending electrode portion 141 of the second capacitor electrode 140 has surfaces opposing the inner surfaces of the surround electrode portion 132, a top surface of the lower electrode portion 131 and the sidewalls of each pillar electrode portion 133. The upper electrode portion 142 of the second capacitor electrode 14 opposes the top surface of the surround electrode portion 132 and the top surface of each pillar electrode portion 133. Because extending electrode portion 141 of the second capacitor electrode 140 opposes the lower electrode portion 131 and the surround electrode portion 132 in three dimensions, the surface area As for the capacitor C1 is increased with high integration. The pillar electrode portions 133 of the first capacitor electrode 130 extending to the upper electrode portion 142 of the second capacitor electrode 140 and into the extending electrode portion 141 of the second capacitor electrode 140, further increases the surface area As for the capacitor C1 while maintaining high integration.

As shown in FIG. 1a, the upper electrode portion 142 of the second capacitor electrode 140 can be in the wiring level WL of the third wiring line 125 and the extending electrode portion 141 of the second capacitor electrode 140 is in the wiring level WL of the second wiring line 123. The surround electrode portion 132 of the first capacitor electrode 130 and each pillar electrode portion 133 of the first capacitor electrode 130 are in the wiring level WL of the second wiring line 123. The lower electrode portion 131 of the first capacitor electrode 130 is in the wiring level WL of the first wiring line 121. After the formation of the first capacitor electrode 130 in the wiring levels of the first and second wiring lines 121 and 123, an opening 145 is made in the third dielectric layer 113 directly above each pillar electrode portion 133 and at least a portion of the upper surface of the surround electrode portion 132.

Figure 1C:
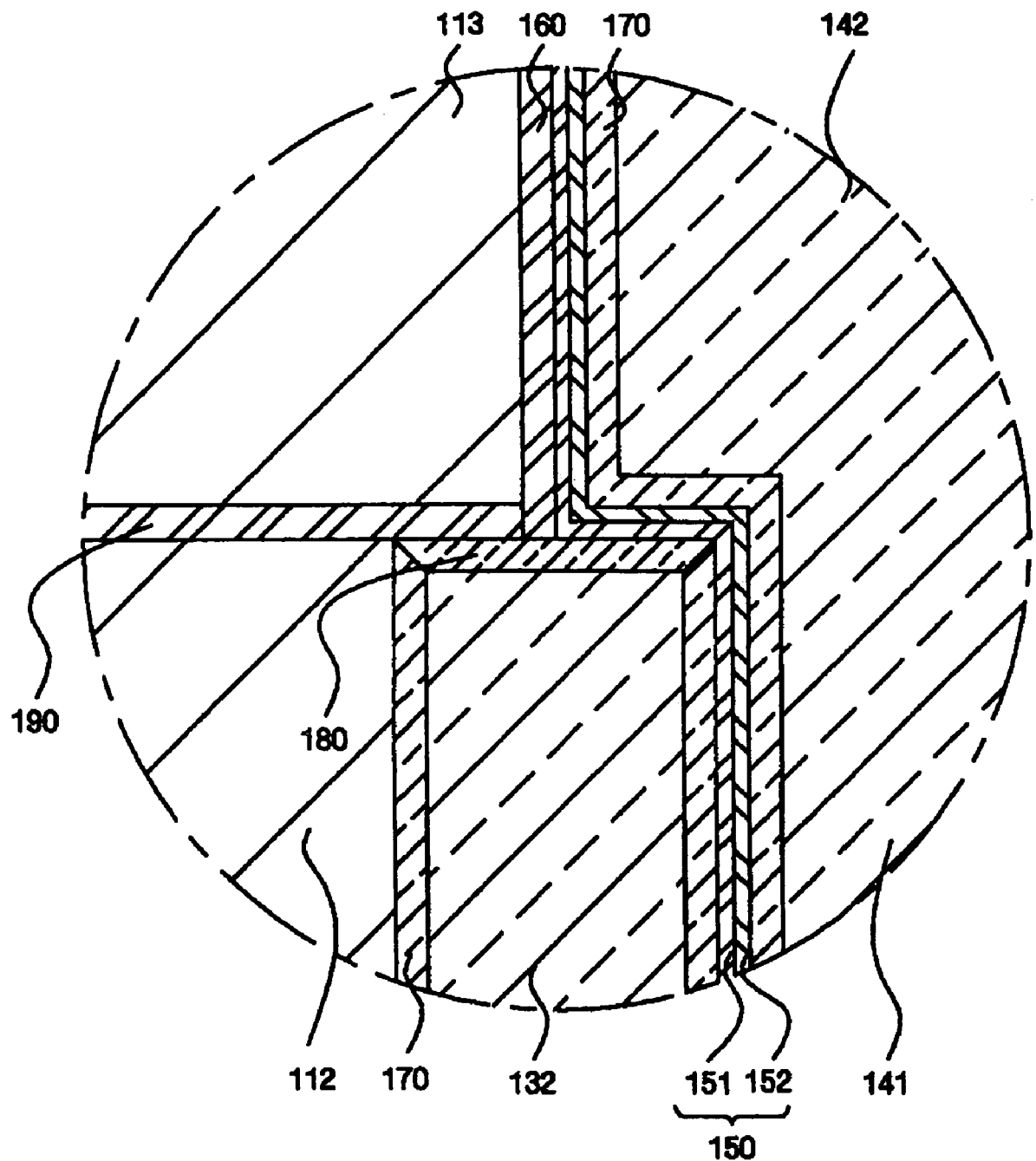

FIG. 1c. is an expanded cross-sectional view illustrating the cross-sectional area B-B' of FIG. 1a. A spacer 160 is on the sidewall opening 145 down to the cap layer 170 on the upper surface of the surround electrode portion 132. The spacer 160 protects the third dielectric layer 113 from subsequent fabrication processes for forming the second capacitor electrode 140. The spacer 160 can be formed of dielectric material resistant to wet etching, such as SiN, SiC or SiNC.

As shown in FIGS. 1a and 1c, a dielectric film 150 for insulating the first capacitor electrode 130 from the second capacitor electrode 140 is on the lower electrode portion 131, the surround electrode portion 132, each pillar electrode portion 133 and the spacer 160. The dielectric film can be at least one of a nitride containing material, an oxide containing material, and a laminate of a nitride material 151 and an oxide material 152. The nitride material 151 can be formed of at least one of SiN, SiON, SiCN and AlN. The oxide material 152 can be formed of at least one of SION, $HfO_2$, $Ta_2O_5$, $Al_2O_3$, $ZrO_2$, STO, $Pr_2O_3$, and $La_2O_3$. In the alternative, the dielectric film can be a composite layer of SiN, SiON, SiCN, $HfO_2$, $Ta_2O_5$, $Al_2O_3$, AlN, $ZrO_2$, STO, $Pr_2O_3$ and $La_2O_3$.

Figure 2:
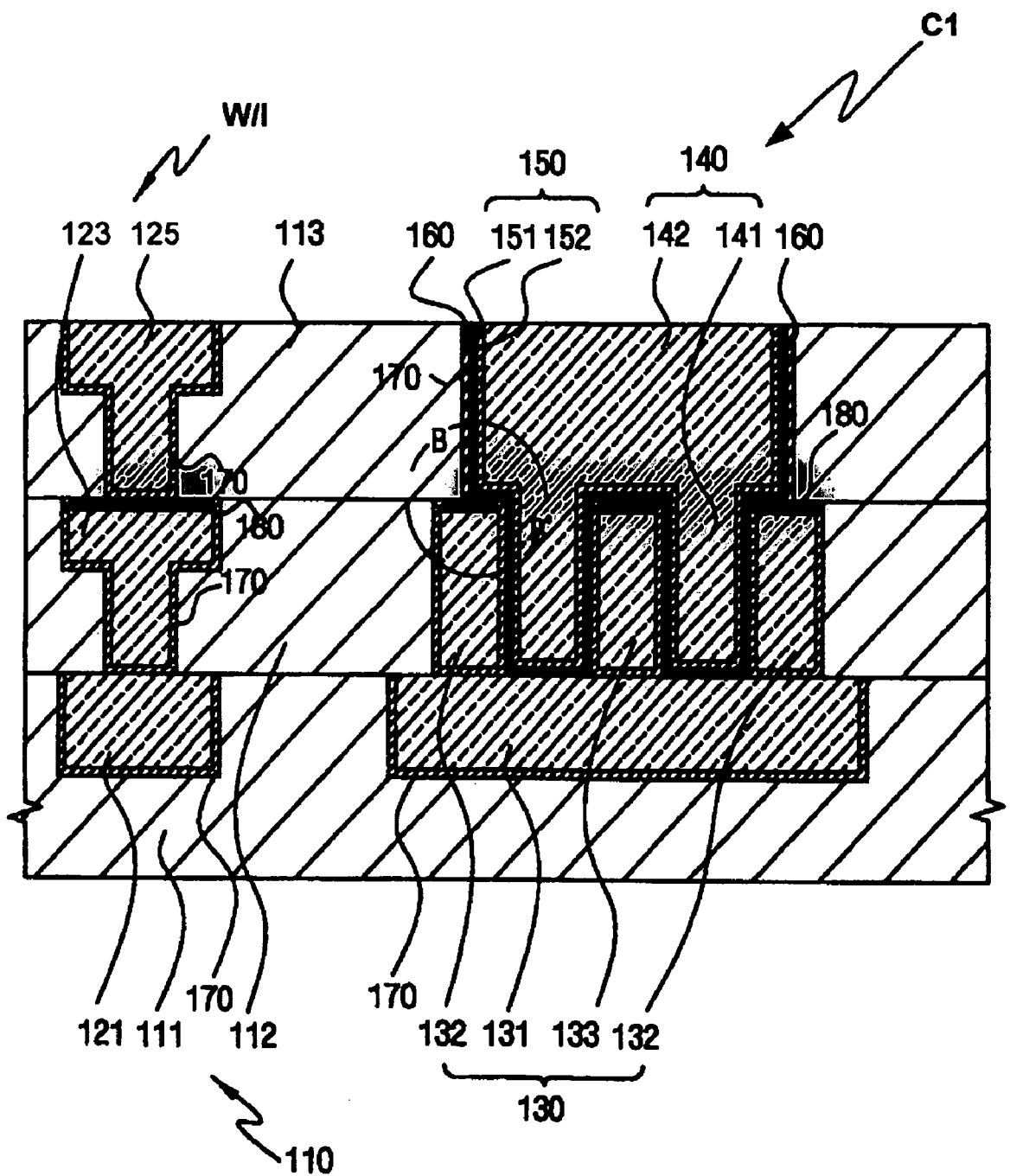
FIG. 2 is a cross-sectional view of a three dimensional MIM capacitor according to a second embodiment of the present invention.

FIG. 2 is a cross-sectional view of a three dimensional MIM capacitor according to a second embodiment of the present invention. The 3D MIM capacitor according to the second embodiment of the present invention is similar to the first embodiment of the present invention shown in FIG. 1, except for the second embodiment of the present invention shown in FIG. 2 does not have etch-stop layers between or on the dielectric layers. An etch-stop layer between dielectric layers may increase the overall dielectric coefficient K of the dielectric layers together with the etch-stop layer. To prevent an increase in dielectric coefficient K, the etch-stop layers between the dielectric layers are omitted.

As shown in FIG. 2, the third dielectric layer 113 is on the second dielectric layer 112, which is on the first dielectric layer 111. The wiring lines 121, 123 and 125 of the wiring levels in FIG. 2 are shown in trenches of individual dielectric layers 111, 112 and 113. However, wiring lines 121, 123 and 125 wiring lines can in effect share the same dielectric layer or all be in the same dielectric layer if the dielectric material of each dielectric layer is the same dielectric material. A low-k dielectric material can be used to reduce parasitic capacitance.

When the etch-stop dielectric layers are omitted, the etching of the contact holes is selectively performed or done with other etching processes that prevent over etching. Although all of the etch-stop layers are shown to be omitted from FIG. 2, a single etch-layer can be omitted or only two of the etch-stop layers can be omitted. For example, only the second etch-stop layer 115 shown in FIG. 2 can be omitted, or both the first etch-stop layer 114 and the second etch-stop layer 115 shown in FIG. 2 can be omitted.

Figure 3:
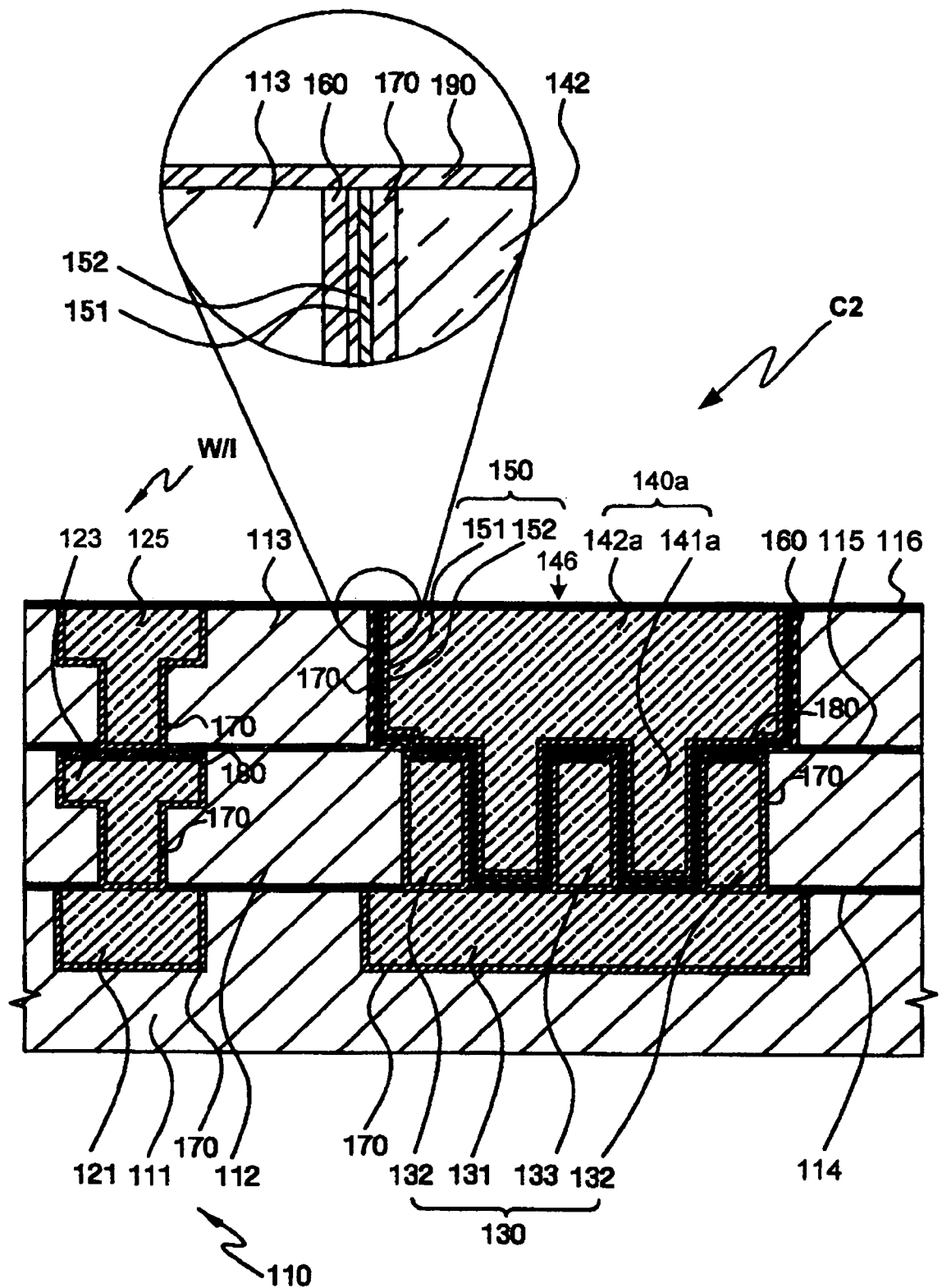
FIG. 3 is a cross-sectional view of a three dimensional MIM capacitor according to a third embodiment of the present invention.

FIG. 3 is a cross-sectional view of a three dimensional MIM capacitor according to the third embodiment of the present invention. The 3D MIM capacitor according to the third embodiment of the present invention is similar to the first embodiment of the present invention shown in FIG. 1, except for the upper electrode portion of the second capacitor electrode overlaps the top surface of the surround electrode portion of the first capacitor electrode. As shown in FIG. 3, the upper electrode portion 142a of the first capacitor electrode 140a overlaps and extends beyond the top surface of the surround electrode portion 132 of the first capacitor electrode 130. The complete overlapping of the upper electrode portion 142a over the top surface of the surround electrode portion 132 increases the surface area As such that the capacitor C2 of the third embodiment of the present invention has a larger capacitance than the capacitor C1 of the first embodiment of the present invention, as shown in FIG. 1a, while maintaining high integration.

Because the upper electrode portion 142A completely overlaps the top surface of the surround electrode portion 132, the opening 146 in the third dielectric layer 113 is wider than the opening 145 in the first embodiment of the present invention shown in FIG. 1a. The spacer 160 is on the sidewall of the opening 146 in the third dielectric layer 113 similar to the first embodiment of the present invention shown in FIG. 1a. However, the spacer 160 is also on a top surface of the second dielectric layer 112, as shown in FIG. 1. The dielectric film 150 is on the spacer 160 similar to the first embodiment of the present invention shown in FIG. 1a.

Figure 4:
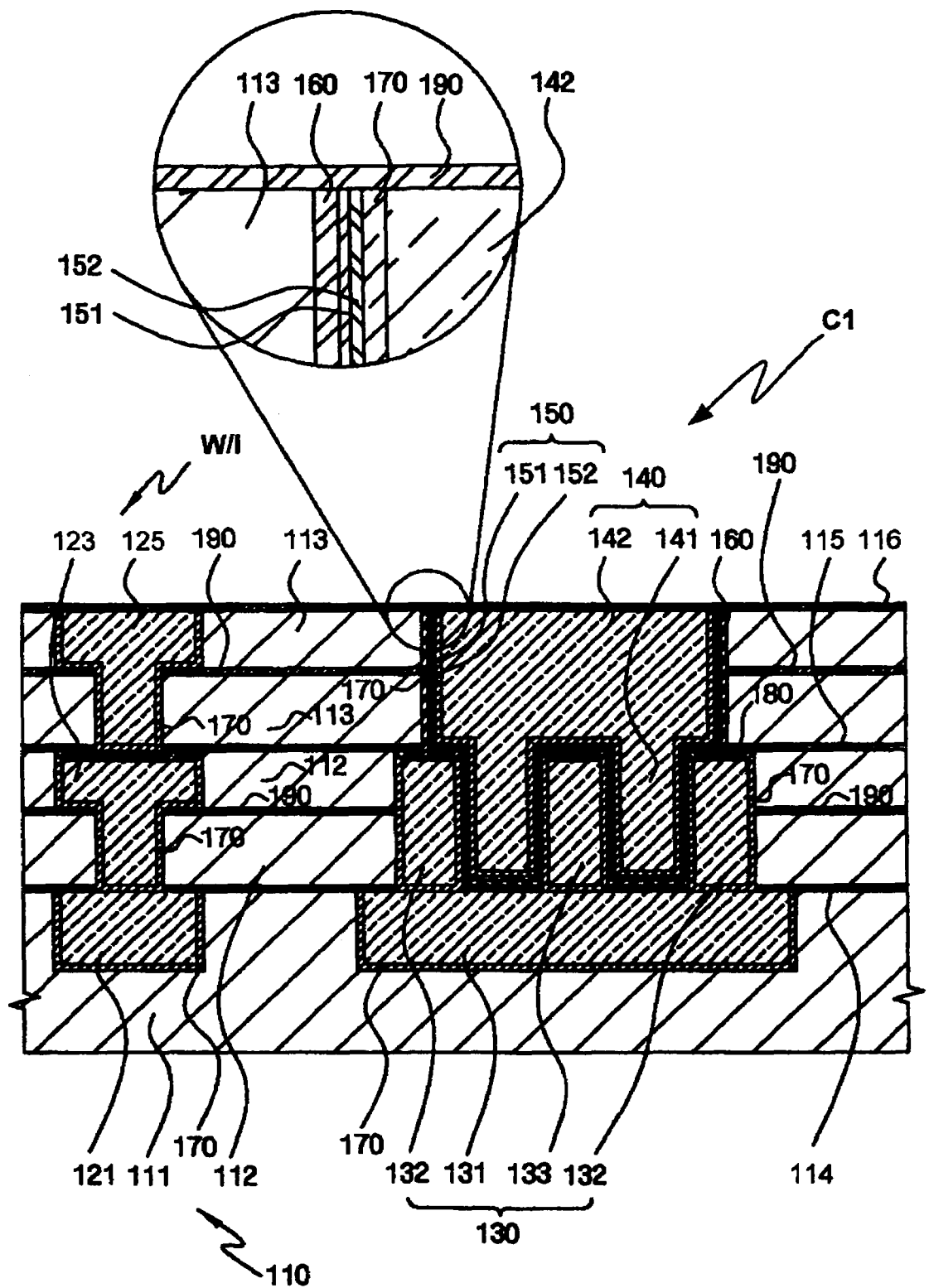
FIG. 4 is a cross-sectional view of a three dimensional MIM capacitor according to a fourth embodiment of the present invention.

FIG. 4 is a cross-sectional view of a three dimensional MIM capacitor according to a fourth embodiment of the present invention. The 3D MIM capacitor according to the fourth embodiment of the present invention is similar to the first embodiment of the present invention shown in FIG. 1, except for an intermediate etch-stop layer in each of the dielectric layers. As shown in FIG. 4, the second dielectric layer 112 has an intermediate etch-stop layer 190 and the third dielectric layer 113 has an intermediate etch-stop layer 190. The intermediate etch-stop layer enables a consistent etch depth of the trench across the dielectric layer during the trench etching process of a damascene process. The intermediate etch-stop layer 190 can be formed of at least one of SiN, SiNC and other types of dielectric materials used for selective etching to prevent over-etching.

Although FIG. 4 shows each of the dielectric layers including an intermediate etch-stop layer, an intermediate etch-stop can be in only one or two of the first, second and third dielectric layer 111, 112 and 113. For example, only the first dielectric layer 111 shown in FIG. 4 can have an intermediate etch-stop layer 190 while the first and second dielectric layers 112 and 113 do not have an intermediate etch-stop layer 190.

In another example, the first dielectric layer 111 and the third dielectric layer 113 shown in FIG. 4 can each have an intermediate etch-stop layer 190 while the second dielectric layer 112 does not have an intermediate etch-stop layer 190.

Figure 5:
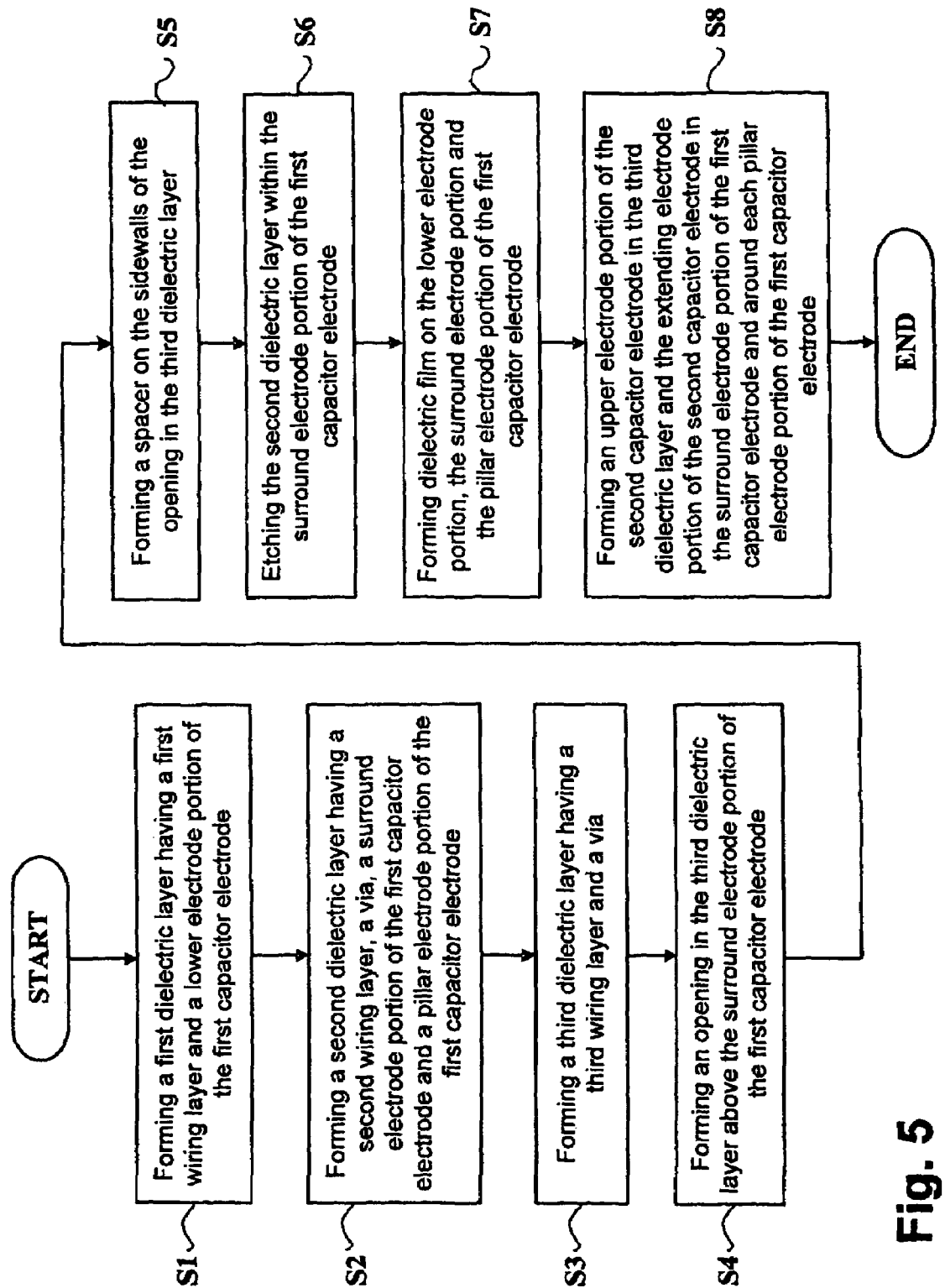

FIG. 5 is a flowchart of a method of manufacturing the three dimensional MIM capacitor shown in FIG. 1a. The processing steps S1-S8 are outlined in FIG. 5, In general, this method of manufacturing forms a portion of the capacitor during a first damascene process, forms another portion of the capacitor during a second damascene process, performs a third damascene process, and then completes the fabrication of the capacitor. FIGS. 6a to 6i are cross-sectional views of structures resultant from the method of manufacturing outlined in FIG. 5.

Figure 6A:
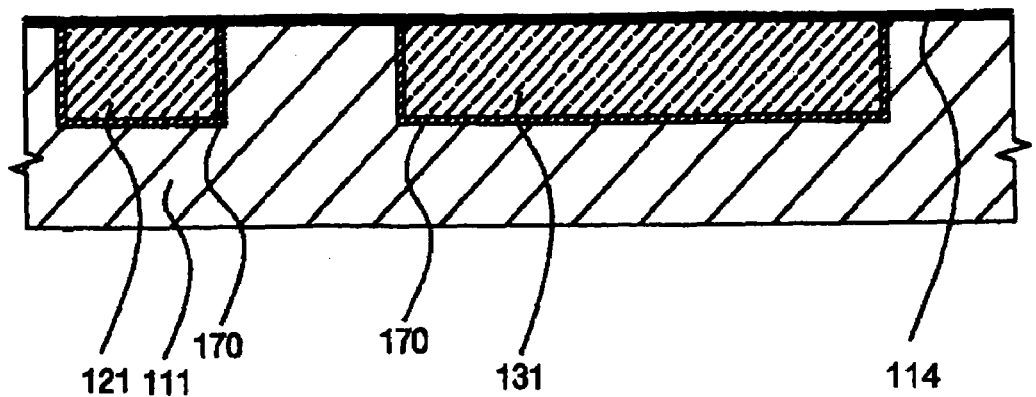
FIGS. 6a to 6i are cross-sectional views of structures resultant from the method of manufacturing outlined in FIG. 5.

FIG. 6a shows the resultant structure for the step S1 in FIG. 5 of forming a first dielectric layer having a first wiring line and a lower electrode portion of the first capacitor electrode. As shown in FIG. 6a, a first dielectric layer 111 is provided with a trench for the first wiring line 121 and an opening for the lower electrode portion 131 of the first capacitor electrode. The opening for the lower electrode portion 131 of the first capacitor electrode can adjoin a trench in the first dielectric layer 111 such that the lower electrode portion of the first capacitor will be integrally connected with a wiring line in the first dielectric layer 111 when the conductive material for the wiring line and lower electrode portion is deposited.

The first dielectric layer 111 can be provided on a substrate (not shown). Such a substrate can be a single crystalline semiconductor substrate having semiconductor devices therein or a polycrystalline semiconductor substrate having semiconductor devices therein. In another alternative, the substrate can be formed of an insulating layer. Such an insulating layer can be another dielectric layer, which may contain wiring lines and/or vias.

The first wiring line 121 and the lower electrode portion 131 of the first capacitor are formed in the first dielectric layer 111 of FIG. 1a can be formed with a single damascene process, which includes the processes of photolithography, etching, deposition and CMP. However, if a via is needed for contacting a device or wiring line below the first dielectric layer 111, a dual damascene process can be used to form the first wiring line 121 and the lower electrode portion 131 in the first dielectric layer 111. The single damascene process starts with forming a first photoresist (not shown) over the first dielectric layer 111 by photolithography. The first photoresist defines first areas of the first dielectric layer 111 to be etched for the trench and for the opening. The first defined areas of the first dielectric layer 111 are then etched with a controlled etch to the same depth to form the opening for the lower electrode portion 131 and the trench for the first wiring line 121. A barrier metal is then deposited to form barrier layers 170 in the trench for the first wiring line 121 and in the opening for the lower electrode portion 131. Then, the first photoresist is removed. A conductive material, such as copper or aluminum is deposited in the barrier layer lined trench for the first wiring line 121 and the barrier layer lined opening for the lower electrode portion 131. The conductive material deposition overfills the trench for the first wiring line 121 and the opening for the lower electrode portion 131. A chemical-mechanical polish process planarizes the top surfaces of the first wiring line 121 and the lower electrode portion 131 to the top surface of the first dielectric layer 111. Then, a first etch-stop layer 114 is deposited over the first wiring line 121, the lower electrode portion 131 and the first dielectric layer 111.

Figure 6B:
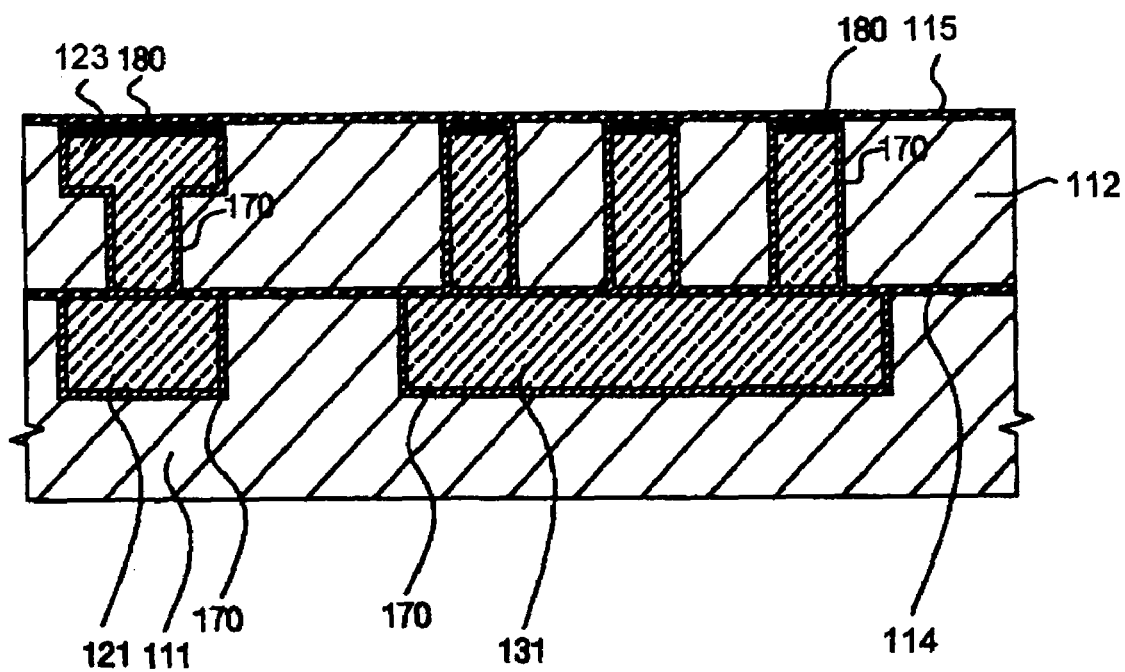

FIG. 6b shows the resultant structure for the step S2 in FIG. 5 of forming a second dielectric layer having a second wiring layer, a via, a surround electrode portion of the first capacitor electrode and a pillar electrode portion of the first capacitor electrode. A dual damascene process can be used to form the second wiring layer 123, the first via 122, the surround electrode portion 131 of the first capacitor electrode and the pillar electrode portion 133 in the second dielectric layer 112. The dual damascene process can be either a trench-first or hole-first dual damascene process. Each of these processes is first started by forming the second dielectric layer 112 over the first dielectric layer 111.

In the hole-first dual damascene method for the second dielectric layer 112, a second photoresist (not shown) is provided on the second dielectric layer 112 by photolithography that defines first areas of the second dielectric layer 112 for the openings of the first via 122, the surround electrode portion 132 and each pillar electrode 133. The defined first areas of the second dielectric layer 112 are then etched to the first etch-stop layer 114. The portions of the first etch-stop layer 114 at the bottoms of the openings are then removed. The second photoresist is then stripped off. A third photoresist (not shown) is then formed by photolithography that defines second area of the second dielectric layer 112 for the trench of the second wiring layer 123 and fills the openings of the first via 122, the surround electrode portion 132 and each pillar electrode 133. The second defined area of the second dielectric layer 112 is then etched to form the trench of the second wiring layer 123. A barrier metal is then deposited to form barrier layers 170 in the trench and in the openings of the second dielectric layer 112. Then, the third photoresist is removed. A conductive material, such as copper or aluminum is deposited in the barrier layer lined trench for the second wiring line 123, in the barrier lined opening for the first via 122, in the barrier layer lined opening for the surround electrode portion 132 and in the barrier layer lined opening for each pillar electrode portion 133. The conductive material deposition overfills the trench for the second wiring line 123 and the openings for the first via 122, the surround electrode portion 132 and each pillar electrode portion 133. A chemical-mechanical polish process planarizes the top surfaces of the second wiring line 123, the surround electrode portion 132 and each pillar electrode portion 133 to the top surface of the second dielectric layer 111. The second wiring line 123, the surround electrode portion 132 and each pillar electrode portion 133 are then slightly etched by a selective etch. A cap layer metal is then deposited so as to overfill the trench for the slightly-etched second wiring line 123 and the openings for the slightly-etched surround electrode portion 132 and each slightly-etched pillar electrode portion 133. A chemical-mechanical polish process planarizes the top surfaces of the cap layers 180 on the second wiring line 123, the surround electrode portion 132 and each pillar electrode portion 133 to the top surface of the second dielectric layer 111. Then, an etch-stop layer 115 is deposited over the second wiring line 123, the surround electrode portion 132, each pillar electrode portion 133 and the second dielectric layer 112.

In the trench-first dual damascene method for the second dielectric layer 112, a second photoresist (not shown) is provided on the second dielectric layer 112 by photolithography that defines first areas of the second dielectric layer 112 for the trench of the second wiring layer 123 and the openings of the surround electrode portion 132 and each pillar electrode 133. The defined first areas of the second dielectric layer 112 is then etched with a controlled etch to a predetermined depth. The second photoresist is then stripped off. A third photoresist (not shown) is then formed by photolithography that defines the second areas of the second dielectric layer 112 for the openings of the first via 122, the surround electrode portion 132 and each pillar electrode 133. The second defined areas of the second dielectric layer 112 are then etched to the first etch-stop layer 114. The portions of the etch-stop layer 114 at the bottoms of the openings in the second dielectric layer 112 are then removed. A barrier metal is then deposited to form barrier layers 170 in the trench of the second dielectric layer 112 and in the openings the second dielectric layer 112. Then, the third photoresist is removed. A conductive material, such as copper or aluminum, is deposited in the barrier layer lined trench for the second wiring line 123, in the barrier lined opening for the first via 122, in the barrier layer lined opening for the surround electrode portion 132 and in the barrier layer lined opening for each pillar electrode portion 133. The conductive material deposition overfills the trench for the second wiring line 123 and the openings for the first via 122, the surround electrode portion 132 and each pillar electrode portion 133. A chemical-mechanical polish process planarizes the top surfaces of the second wiring line 123, the surround electrode portion 132 and each pillar electrode portion 133 to the top surface of the second dielectric layer 112. The second wiring line 123, the surround electrode portion 132 and each pillar electrode portion 133 are then slightly etched by a selective etch. A cap layer metal is then deposited so as to overfill the trench for the slightly-etched second wiring line 123 and the openings for the slightly-etched surround electrode portion 132 and each slightly-etched pillar electrode portion 133. A chemical-mechanical polish process planarizes the top surfaces of the cap layers 180 on the second wiring line 123, the surround electrode portion 132 and each pillar electrode portion 133 to the top surface of the second dielectric layer 111. Then, a second etch-stop layer 115 is deposited over the second wiring line 123, the surround electrode portion 132, each pillar electrode portion 133 and the second dielectric layer 112.

Figure 6C:
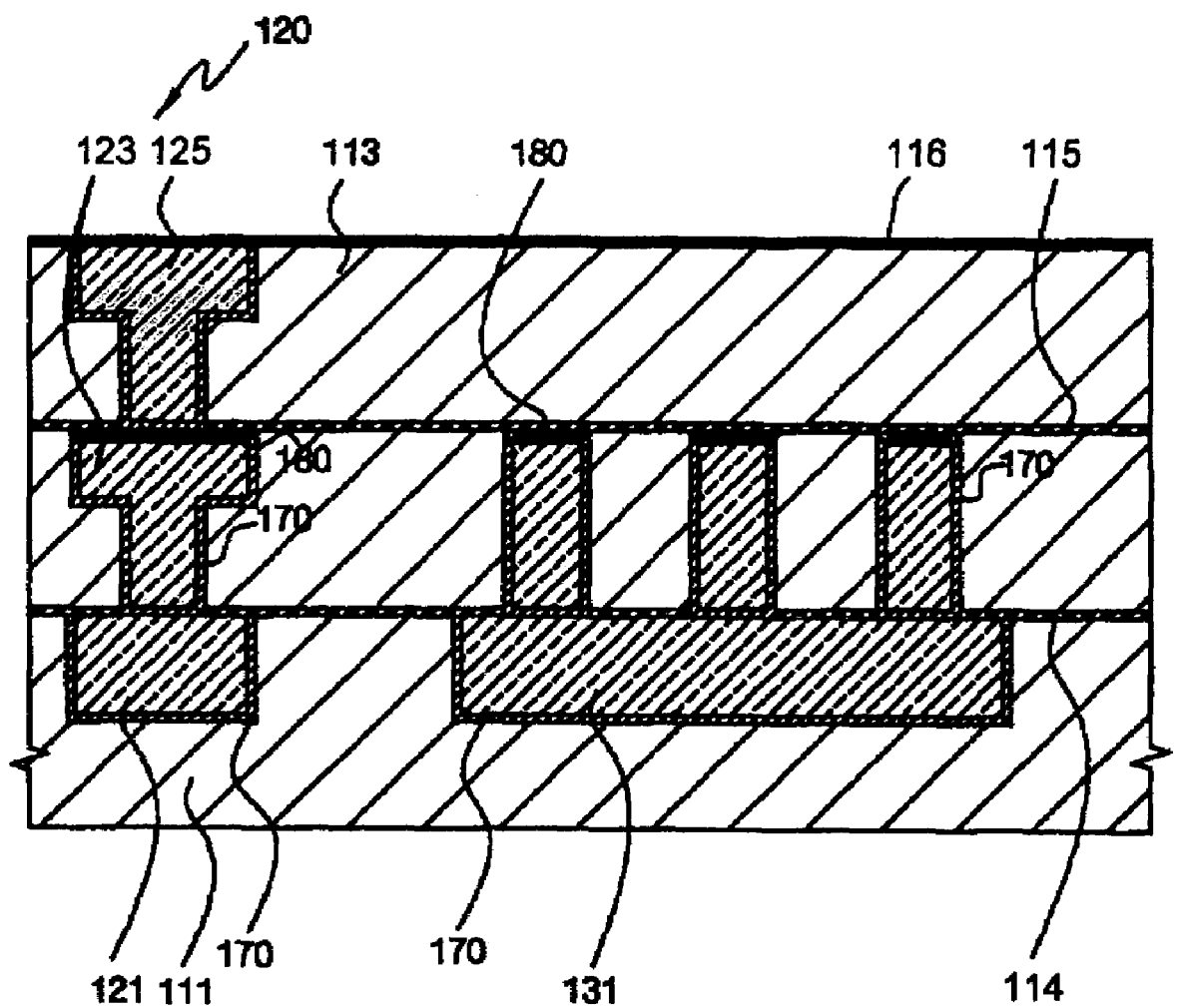

FIG. 6c shows the resultant structure for the step S3 of forming a third dielectric layer having a third wiring layer and a via. A dual damascene process can be used to form the third wiring layer 125 and the second via 124 in the third dielectric layer 112. The dual damascene process can be either a trench-first or hole-first dual damascene process. Each of these processes is first started by forming the second dielectric layer 113 over the first dielectric layer 112.

In the hole-first dual damascene method for the third dielectric layer 113, a fourth photoresist (not shown) is provided on the third dielectric layer 113 by photolithography that defines a first area of the third dielectric layer for the opening of the second via 124. The first defined area of the third dielectric layer 112 is then etched to the second etch-stop layer 115 to form the opening. The portion of the second etch-stop layer 115 at the bottom of the opening is then removed. The fourth photoresist is then stripped off. A fifth photoresist (not shown) is then formed by photolithography that defines a second area of the third dielectric layer 113 for the trench of the third wiring layer 125. The second defined area of third dielectric layer 123 is then etched to form the trench of the second wiring layer 123. A barrier metal is then deposited to form barrier layers 170 in the trench and in the opening. Then, the fifth photoresist is removed. A conductive material, such as copper or aluminum is deposited in the barrier layer lined trench for the third wiring line 125 and in the barrier layer lined opening for the second via 124. The conductive material deposition overfills the trench for the third wiring line 125 and the opening for second via 124. A chemical-mechanical polish process planarizes the top surfaces of the third wiring line 125 to the top surface of the third dielectric layer 113. Then, a third etch-stop layer 116 is deposited over the third wiring line 125 and the third dielectric layer 113.

In the trench-first dual damascene method for the third dielectric layer 113, a fourth photoresist (not shown) is provided on the third dielectric layer 113 by photolithography that defines a first area of the third dielectric layer 113 for the trench of the third wiring layer 125. The defined first area of the third dielectric layer 113 is then etched with a controlled etch to a predetermined depth. The fourth photoresist is then stripped off. A fifth photoresist (not shown) is then formed by photolithography that defines a second area of third dielectric layer 114 for an opening of the second via 124. The second defined area of the third dielectric layer 114 is then etched to the etch-stop layer 115 to form the opening. The portions of the second etch-stop layer 115 at the bottom of the opening are then removed. A barrier metal is then deposited to form barrier layers 170 in the trench and in the opening. Then, the fifth photoresist is removed. A conductive material, such as copper or aluminum is deposited in the barrier layer lined trench for the third wiring line 125 and in the barrier layer lined opening for the second via 124. The conductive material deposition overfills the trench for the third wiring line 125 and the opening for second via 124. A chemical-mechanical polish planarizes the top surfaces of the third wiring line 125 to the top surface of the third dielectric layer 113. Then, a third etch-stop layer 116 is deposited over the third wiring line 125 and the third dielectric layer 113.

Figure 6D:
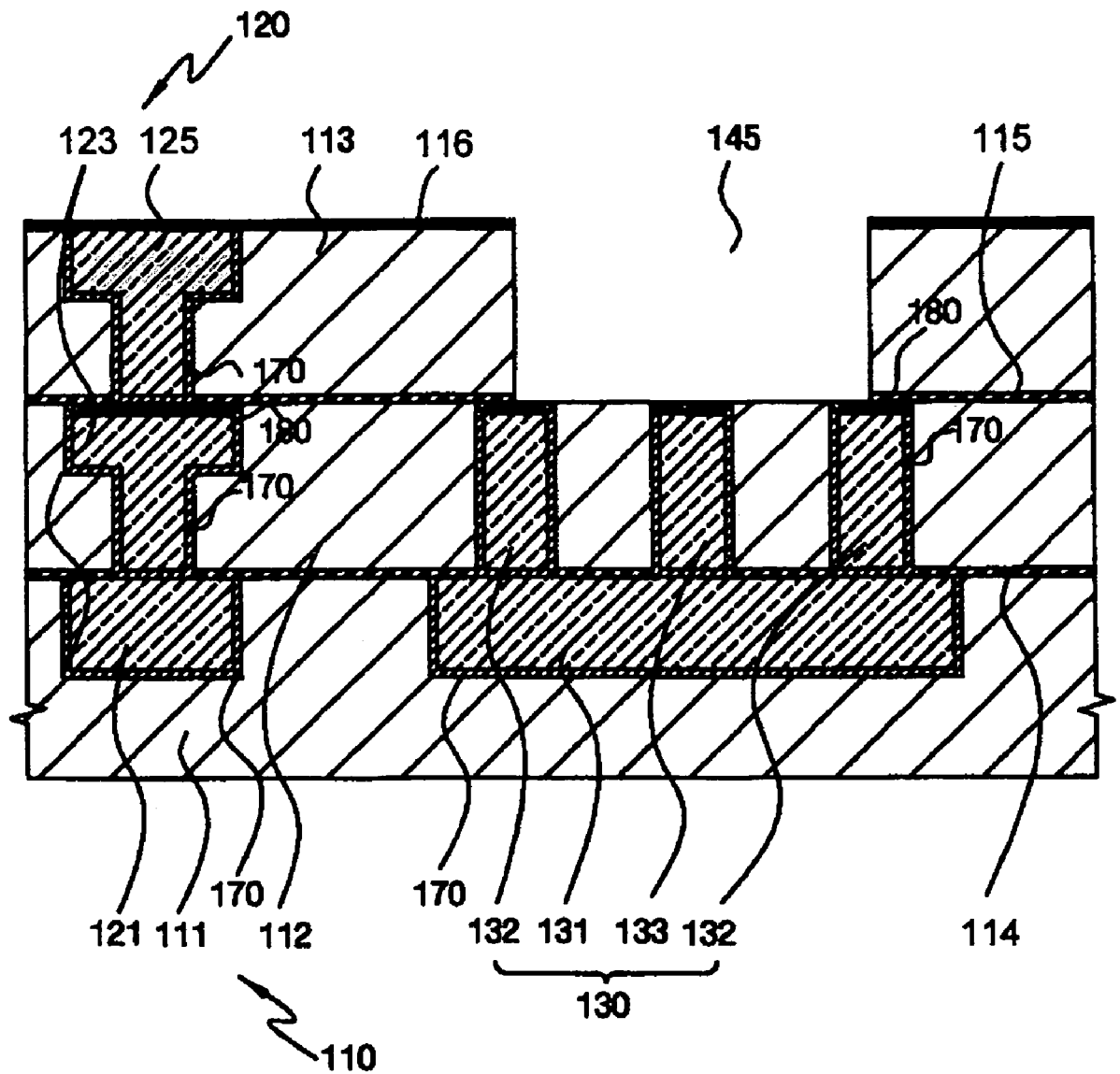

FIG. 6d shows the resultant structure for the step S4 in FIG. 5 of forming an opening in the third dielectric layer above the surround electrode portion of the first capacitor electrode. As shown in FIG. 6d, an opening 145 is formed through the third etch-stop layer 116 and the third dielectric layer 113 down to the cap layers 180 on the surround electrode portion 132. The etching of the third dielectric layer 113 is done by a dry etch.

The formation of the opening 145 is started by forming a sixth photoresist (not shown) by photolithography on the third etch-stop layer 116 that defines an area at which the opening 145 is to be formed. The portion of the third etch-stop layer 116 in the define area is then removed. Subsequently, the third etch-stop layer 116 is dry etched to the second etch-stop layer 115. The portion of the second etch-stop layer 115 at the bottom of the opening 145 is then removed. Then, the sixth photoresist layer is removed.

Figure 6E:
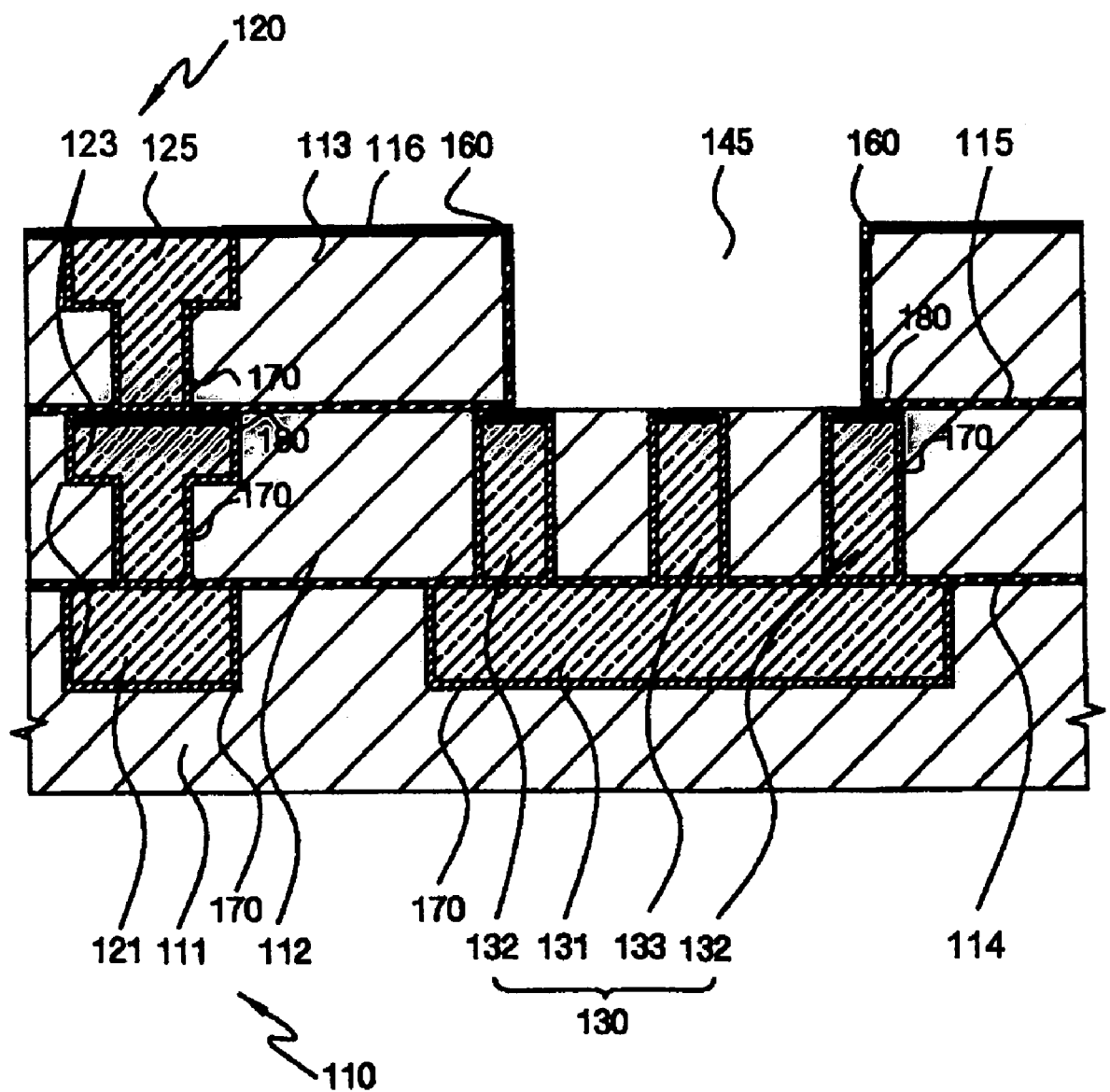

FIG. 6e shows the resultant structure for the step S5 in FIG. 5 of forming a spacer on the sidewalls of the opening in the third dielectric layer. As shown in FIG. 6e, a spacer 160 is formed on the side walls of the third dielectric layer 113 in the opening 145. The spacer 160 can be dielectric material resistant to wet etching, such as SiN, SiC or SiNC. The spacer 160 can be provided by a fabrication process including forming a seventh photoresist layer, depositing the spacer 160 on the side walls of the third dielectric layer 113 in the opening 145, and removing the seventh photoresist.

Figure 6F:
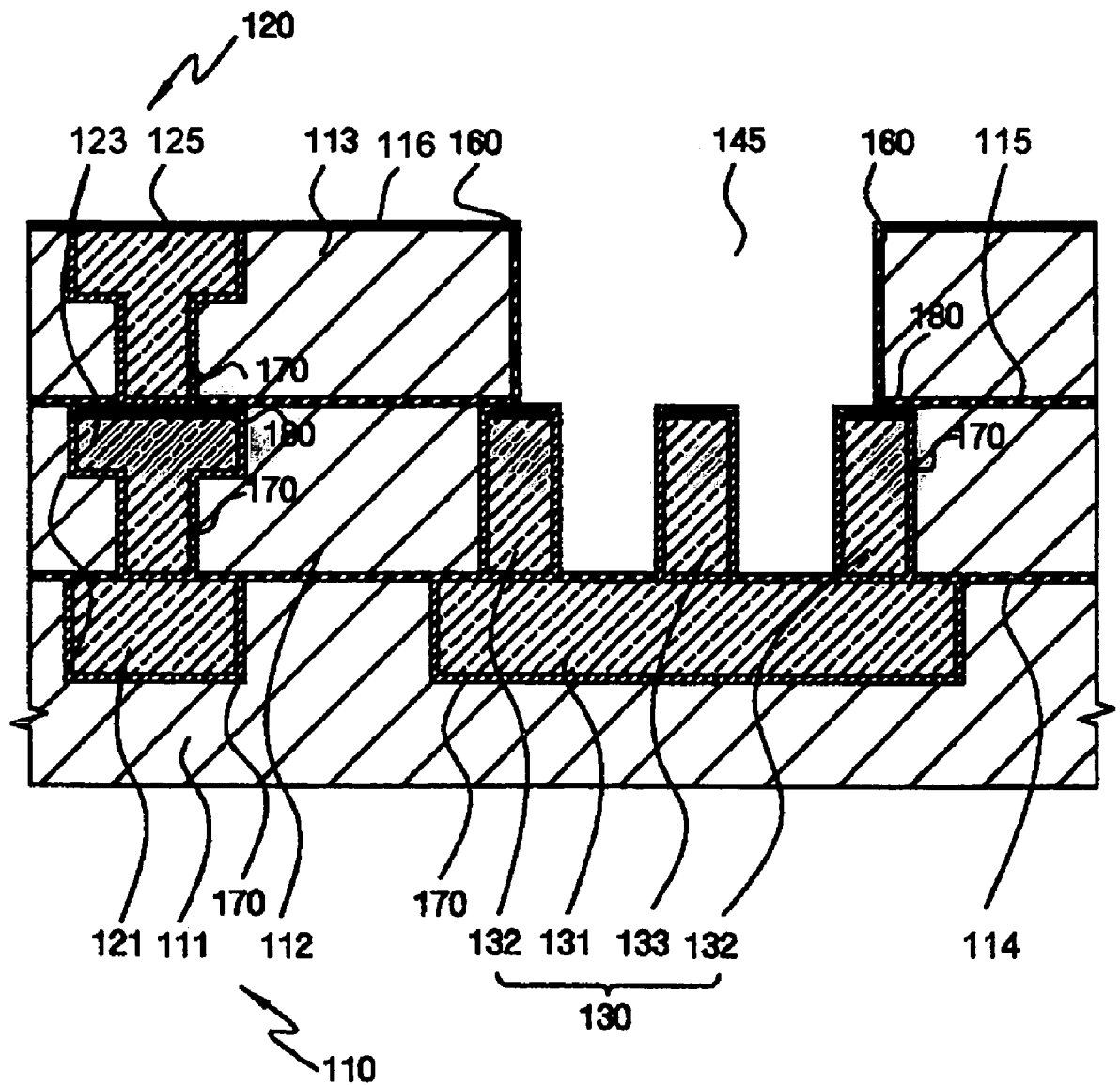

FIG. 6f shows the resultant structure for the step S6 in FIG. 5 of etching the second dielectric layer within the surround electrode portion of the first capacitor electrode. As shown in FIG. 6f, the portion of the second dielectric layer 112 within the surround electrode portion 132 of the first capacitor electrode 130 is etched. This etching also of course removes the portions of the second dielectric layer 112 between each surround electrode portion 133 of the first capacitor electrode 130 be removed by this etching. The etching of the second dielectric layer 112 within the surround electrode portion 132 of the first capacitor electrode 130 is done by wet etching.

The spacer 160 protects the third dielectric layer 113 from the wet etching. The use of the wet etching prevents damage that would otherwise be done to the capping layers 160 and the barrier layers 170, surround electrode portion 132 and/or each pillar electrode 133 by a dry etch. Examples of an etchant for the wet etching include an aqueous ammonia ($NH_3$) solution, a hydrogen peroxide ($H_2O_2$) solution, pure water ($H_2O$), an aqueous nitric acid ($NO_3$) solution, an aqueous hydrochloric acid (HCl) solution and an aqueous sulfuric acid ($H_2SO_4$) solution. These solutions can be used alone or as mixtures thereof.

Figure 6G:
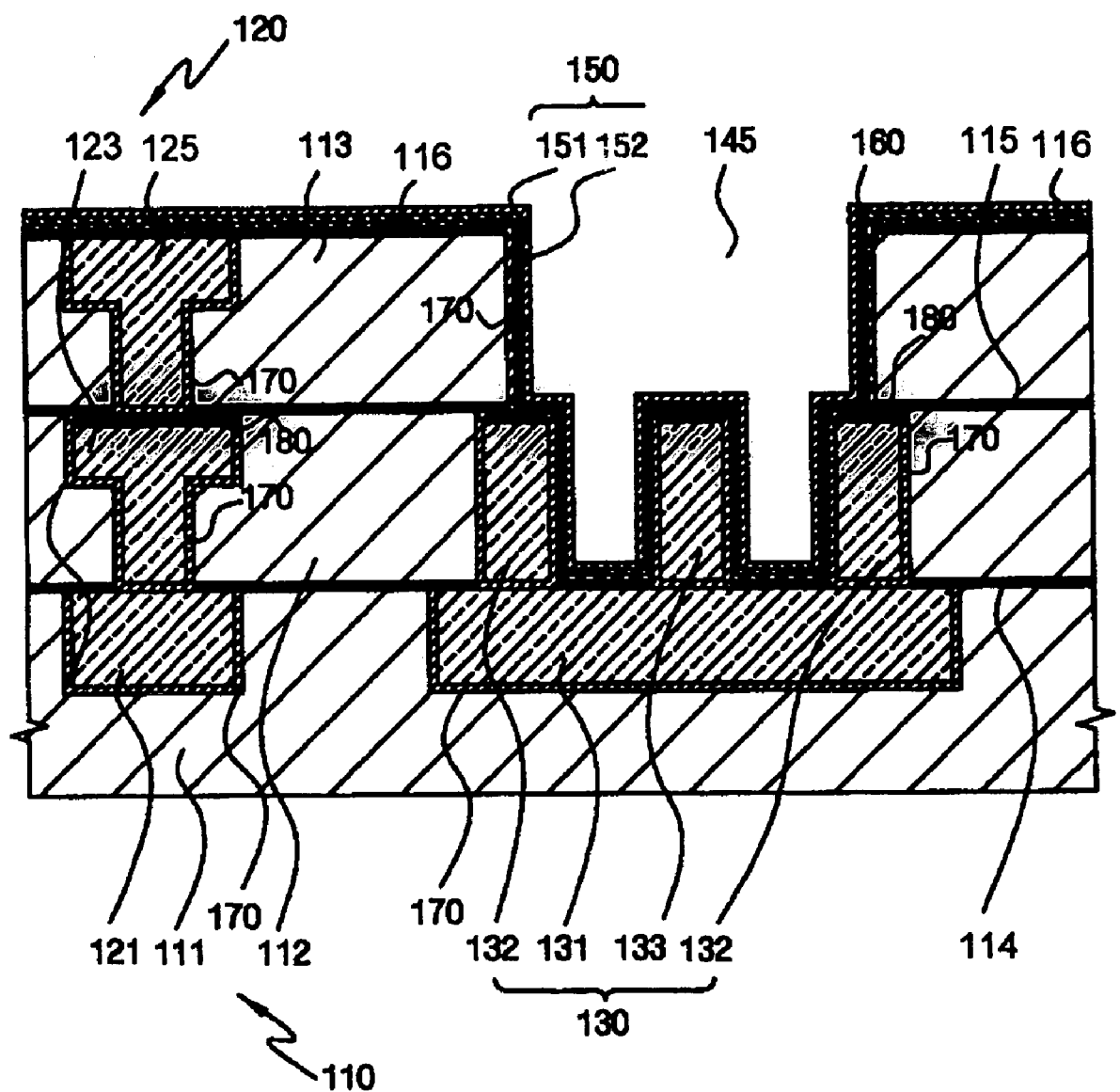

FIG. 6g shows the resultant structure for the step S7 in FIG. 5 of forming dielectric film on the lower electrode portion, the surround electrode portion and the pillar electrode portion of the first capacitor electrode. As shown in FIG. 6g, a dielectric film 150 is formed on the lower electrode portion 131, the surround electrode portion 132 and the pillar electrode portion 133 of the first capacitor electrode 130. A blanket deposition technique is used to form the dielectric film 150 on the lower electrode portion 131, the surround electrode portion 132, the pillar electrode portion 133, the spacer 160 and the third etch-stop layer 116.

The dielectric film can be a nitride containing material, such as SiN, SION, SiCN or AlN, deposited as a single layer or an oxide containing material, such as $HfO_2$, $Ta_2O_5$, $Al_2O_3$, $ZrO_2$, STO, $Pr_2O_3$, and $La_2O_3$, deposited as a single layer. In another alternative, a laminate of a nitride containing layer 151 and an oxide containing layer 152 can be deposited, as shown in FIG. 6g. In yet another alternative, the dielectric film can be deposited as a composite layer of SiN, SiON, SiCN, $HfO_2$, $Ta2O_5$, $Al_2O_3$, AlN, $ZrO_2$, STO, $Pr_2O_3$ and $La_2O_3$.

Figure 6H:
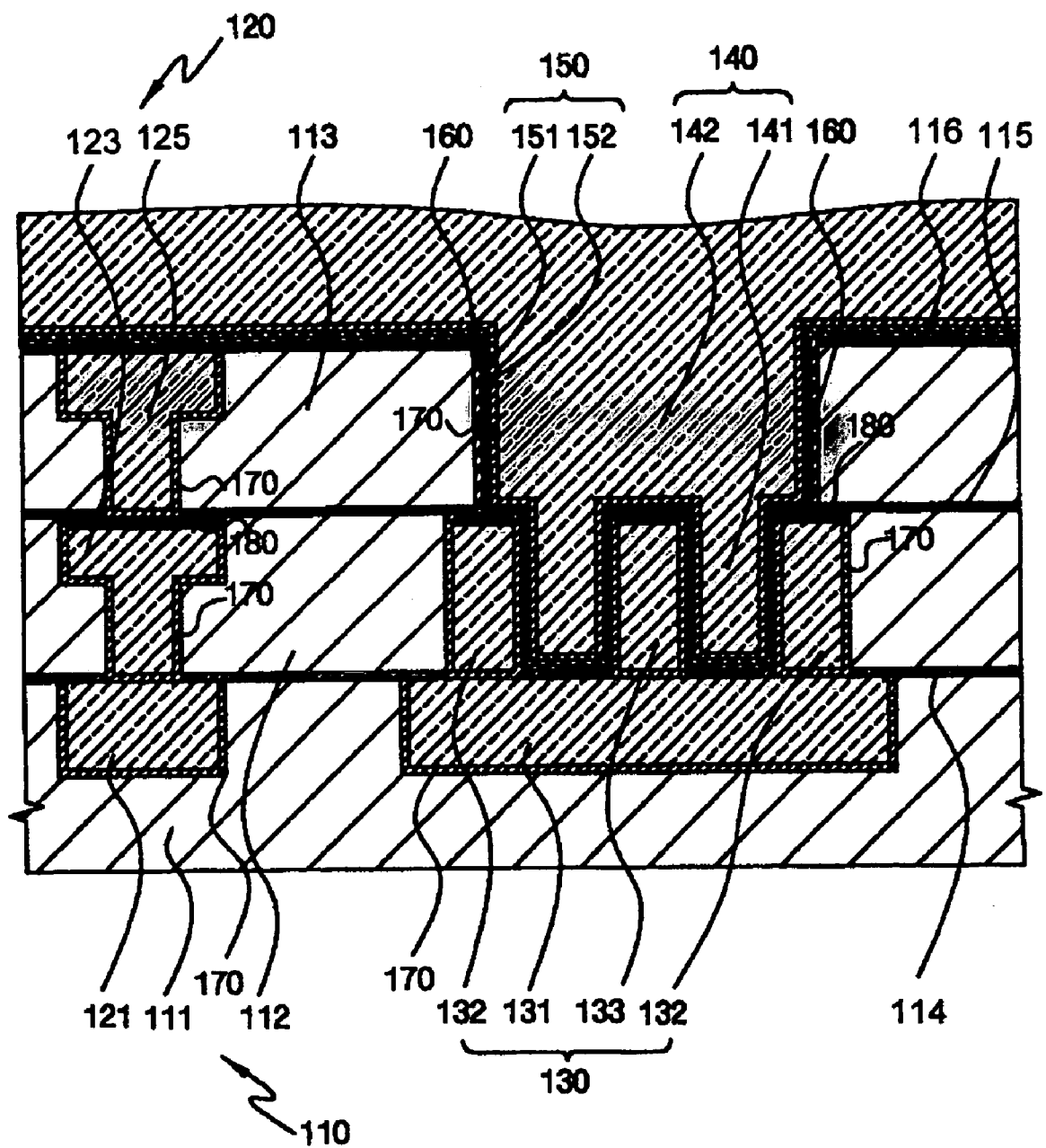
Figure 6I:
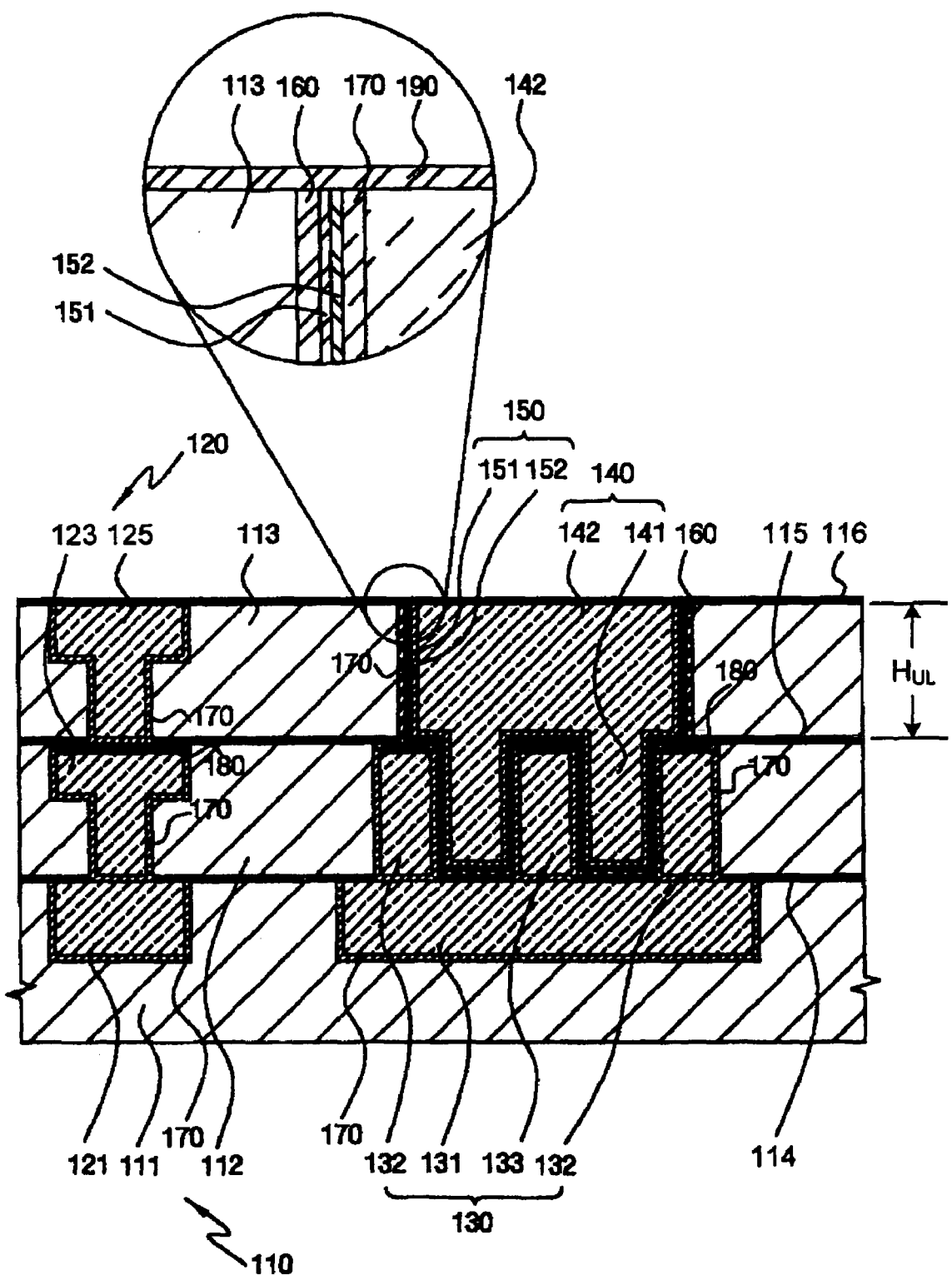
Figure 7:
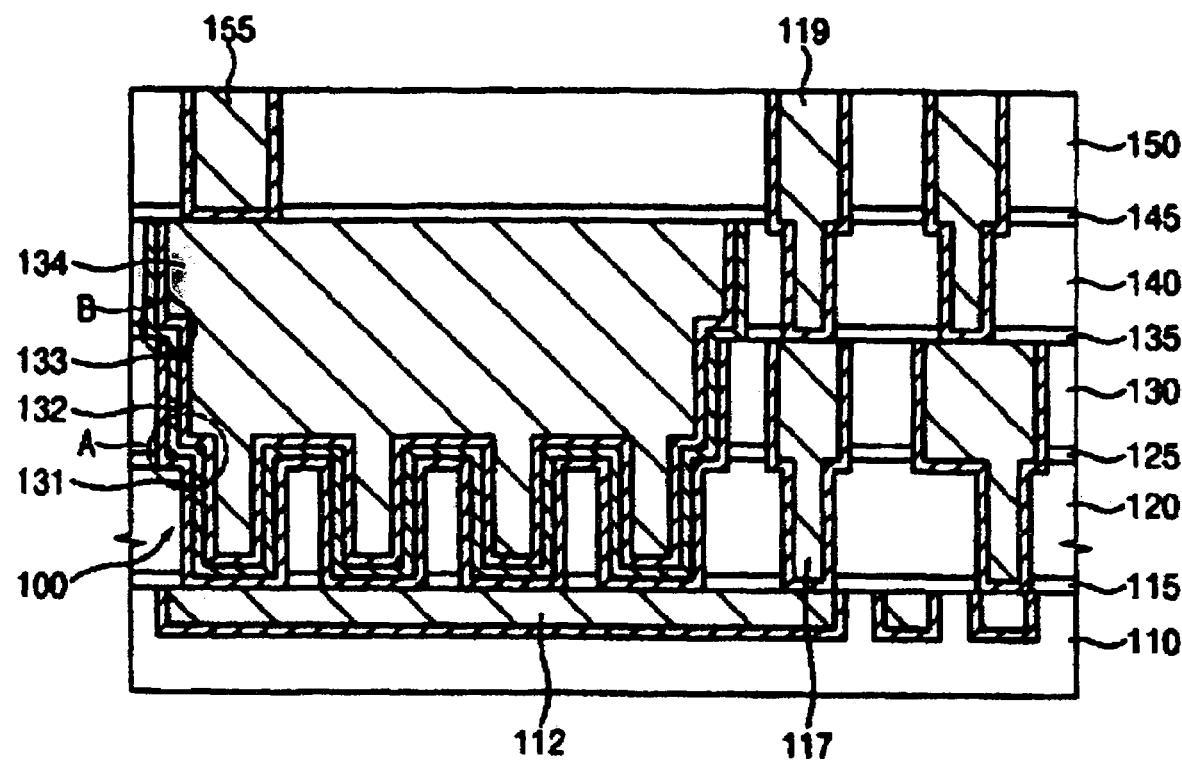
FIG. 7 is a cross-sectional view of an MIM capacitor disclosed in U.S. patent application no. 2006/0009065.
Figure 8:
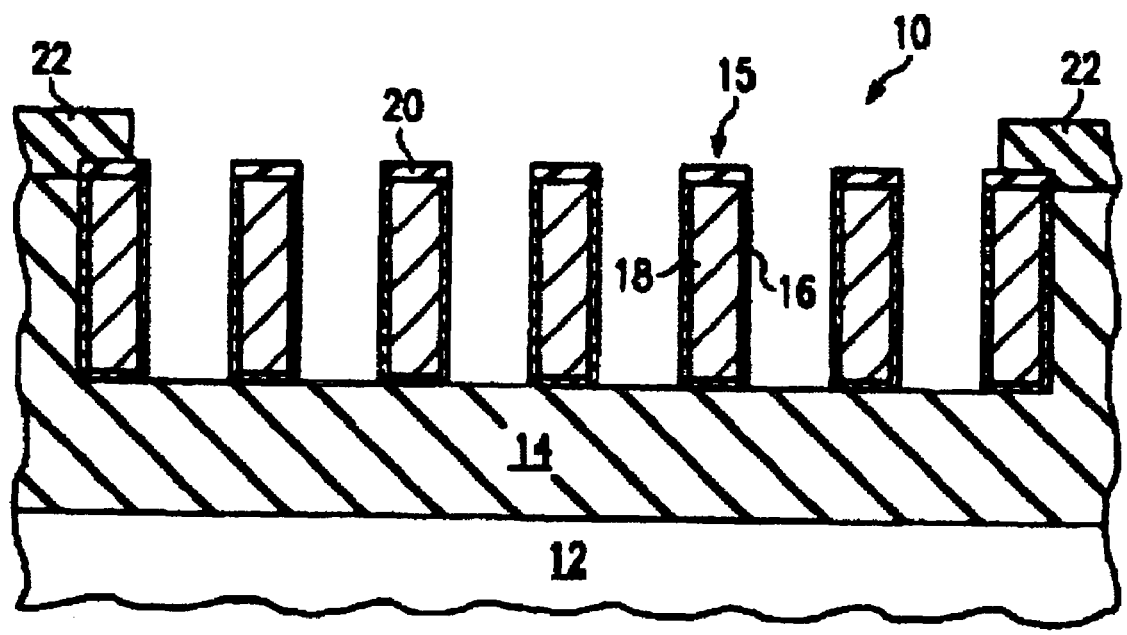
FIG. 8 is a cross-sectional view of an MIM capacitor disclosed in U.S. Pat. No. 6,620,701.
Figure 9:
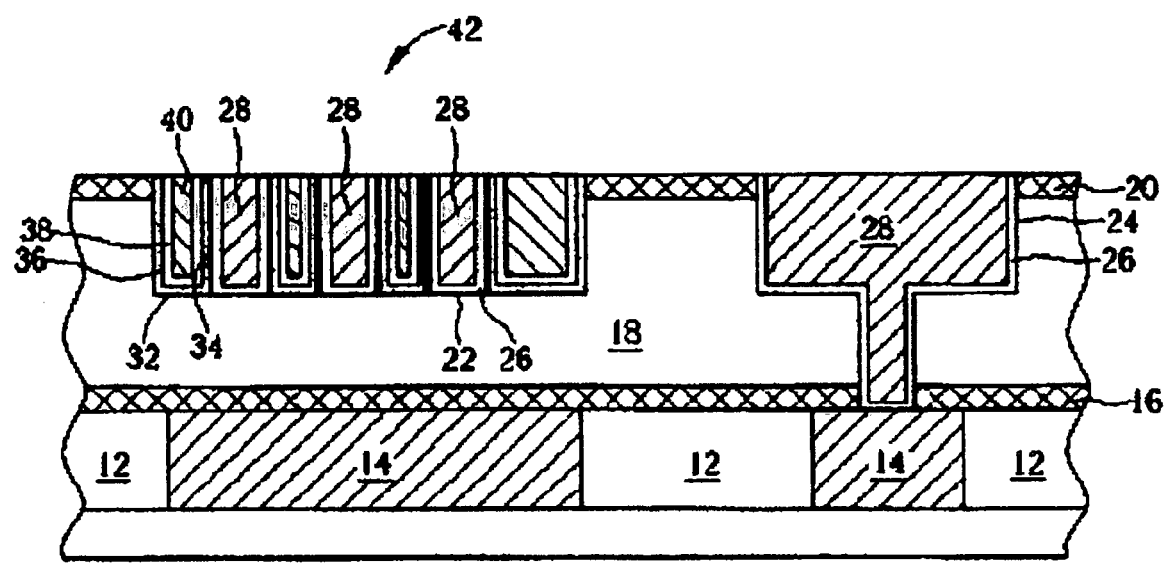
FIG. 9 is a cross-sectional view of an MIM capacitor disclosed in U.S. Pat. No. 6,638,830.
Figure 10:
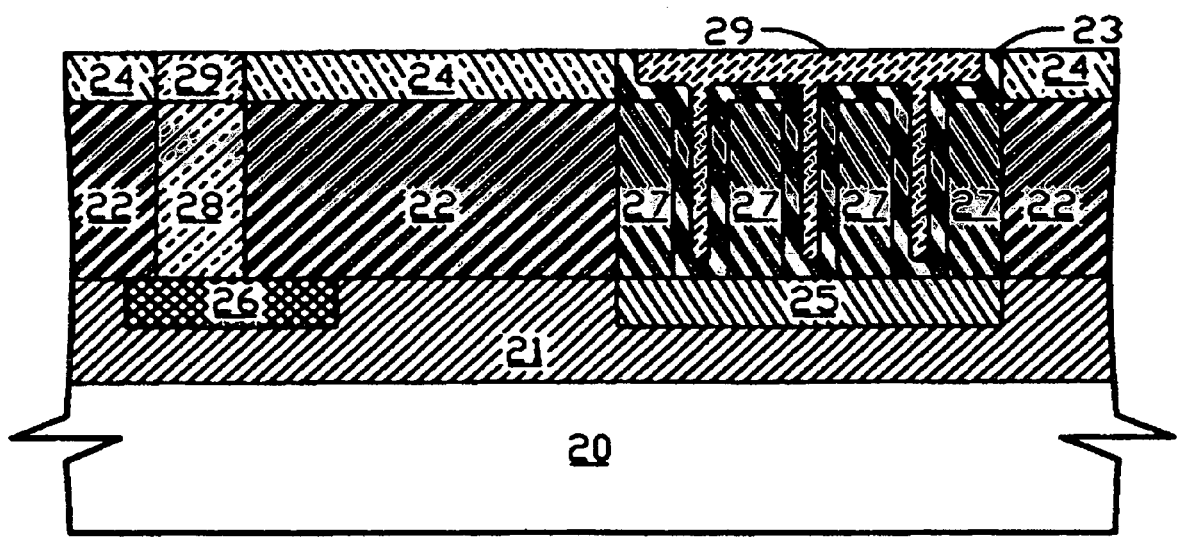
FIG. 10 is a cross-sectional view of an MIM capacitor disclosed in U.S. Pat. No. 6,559,004.

FIG. 6h shows the resultant structure for a part of step S8 in FIG. 5 of forming an upper electrode portion of the second capacitor electrode in the third dielectric layer and the extending portion of the second capacitor electrode in the surround electrode portion of the first capacitor and around each pillar electrode portion of the first capacitor electrode. As shown in FIG. 6h, the upper electrode portion 142 of the second capacitor electrode 140 in the third dielectric layer 113 and the extending electrode portion 141 of the second capacitor electrode 140 in the surround electrode portion 132 of the first capacitor electrode 130 and around each pillar electrode portion 133 of the first capacitor electrode 130 is formed be overfilling the dielectric film lined opening 145 with a conductive material, such as copper or aluminum. FIG. 6i shows the resultant structure for a part of step S8 in FIG. 5 after a CMP of the overfilled conductive material to planarize a top surface of the upper electrode portion 142 of the second capacitor electrode 140 with the upper surface of the third dielectric layer 113. The height $H_{UL}$ of the upper electrode portion 142 of the second capacitor electrode is sufficient to prevent the dielectric film 150 on the top surfaces of each pillar electrode 133 of the first capacitor electrode 130 from being effected by a CMP dishing problem.

According to embodiments of the present invention, an effective surface area As of a first capacitor electrode with respect to a second capacitor electrode is relatively enlarged since the first capacitor electrode is formed with a surround electrode portion and a plurality of pillar electrode portions while the second capacitor electrode extends in to the surround electrode portion of the first capacitor electrode and encompasses each of the pillar electrode portions of the first capacitor electrode, so that a capacitance of the capacitor is remarkably increased. Further, the openings in the dielectric layers for portions of the capacitor and the vias as well as trenches for the wiring lines are formed simultaneously. Furthermore, portions of the capacitor, vias and wiring lines are formed simultaneously. Such simultaneous formations reduce cost and fabrication time.

It will be apparent to those skilled in the art that various modifications and variations can be made in the metal-insulator-capacitor and method of manufacturing the same of the present invention without departing from the spirit or scope of the invention. Thus, it is intended that the present invention cover the modifications and variations of this invention provided they come within the scope of the appended claims and their equivalents.

What is claimed is:

1. A metal-insulator-metal capacitor, comprising:
a first electrode in a first wiring level;
a second electrode above the first wiring level, the second electrode extending into a first portion of the first electrode and extending toward a second portion of the first electrode, wherein the second portion of the first electrode is in a first dielectric layer and the first portion of the first electrode is in a second dielectric layer;
a plurality of third portions of the first electrode extending toward the second electrode;
a dielectric film separating the first electrode from the second electrode; and
a via in the second dielectric layer interconnecting a wiring line of the first wiring level to an other wiring line of an other wiring level,
wherein the first portion of the first electrode surrounds the second electrode and the plurality of third portions of the first electrode, and
wherein a first height of the first portion of the first electrode from the second portion of the first electrode is greater than a second height of the via from the other wiring line to the wiring line of the first wiring level.

2. The metal-insulator-metal capacitor of claim 1, wherein the second electrode is in a second wiring level.

3. The metal-insulator-metal capacitor of claim 1, further comprising:
a first etch stop layer between the first dielectric layer and the second dielectric layer.

4. The metal-insulator-metal capacitor of claim 3, further comprising:
a first intermediate etch stop layer within the first dielectric layer.

5. A metal-insulator-metal capacitor, comprising:
a first dielectric layer;
a lower electrode in the first interlayer dielectric layer;
a second dielectric layer over the first dielectric layer;
a surround electrode in the second dielectric layer and on the lower electrode;
an upper electrode comprising at least one extended portion
a plurality of pillar electrode portions on the lower electrode;
a dielectric film on the lower electrode and the surround electrode to separate the upper electrode from the lower electrode, the surround electrode and the plurality of pillar electrode portions;
a first wiring line within the first dielectric layer;
a second wiring line within the second dielectric layer; and
a first via within the second dielectric layer interconnecting the first wiring line to the second wiring line,
wherein the surround electrode surrounds the at least one extended portion and the plurality of pillar electrode portions, and
wherein a first height of the surround electrode is greater than a second height of the first via.

6. The metal-insulator-metal capacitor of claim 5, further comprising:
   a third dielectric layer over the second dielectric layer, the upper electrode is in the third dielectric layer and the at least one extended portion extends into the surround electrode.

7. The metal-insulator-metal capacitor of claim 6, further comprising:
   a spacer layer positioned between the third dielectric layer and the upper electrode.

8. The metal-insulator-metal capacitor of claim 5, wherein the upper electrode overlaps the surround electrode.

9. the metal-insulator-metal capacitor of claim 5, further comprising:
   a first etch stop layer between the first dielectric layer and the second dielectric layer.

10. The metal-insulator-metal capacitor of claim 9, further comprising:
    a first intermediate etch stop layer within the second dielectric layer.

11. A method of manufacturing a metal-insulator-metal capacitor on a substrate, comprising:
    forming a first dielectric layer over the substrate;
    forming a second portion of a first electrode in the first dielectric layer;
    forming a second dielectric layer on the first dielectric layer;
    forming a first portion of the first electrode and a plurality of third portions of the first electrode in the second dielectric layer and on the second portion of the first electrode;
    forming a dielectric film on the first electrode;
    forming a second electrode above a wiring level of the first electrode, the second electrode extending toward the second portion of the first electrode; and
    forming a via in the second dielectric layer interconnecting a wiring line of the wiring level to an other wiring line of an other wiring level,
    wherein the dielectric film separates the first electrode from the second electrode,
    wherein the first portion of the first electrode surrounds the second electrode and the plurality of third portions of the first electrode, and
    wherein a first height of the first portion of the first electrode from the second portion of the first electrode is greater than a second height of the via from the other wiring line to the wiring line of the wiring level of the first electrode.

* * * * *